(12) United States Patent
Park et al.

(10) Patent No.: US 11,093,824 B2
(45) Date of Patent: Aug. 17, 2021

(54) NEUROMORPHIC DEVICE AND METHOD OF DRIVING THE SAME

(71) Applicant: SAMSUNG ELECTRONICS CO., LTD., Suwon-si (KR)

(72) Inventors: Jea Gun Park, Seongnam-si (KR); Du Yeong Lee, Seoul (KR); Seung Eun Lee, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 186 days.

(21) Appl. No.: 16/330,084

(22) PCT Filed: Sep. 1, 2017

(86) PCT No.: PCT/KR2017/009617
§ 371 (c)(1),
(2) Date: Mar. 2, 2019

(87) PCT Pub. No.: WO2018/044127
PCT Pub. Date: Mar. 8, 2018

(65) Prior Publication Data
US 2019/0251427 A1    Aug. 15, 2019

(30) Foreign Application Priority Data

Sep. 2, 2016   (KR) .......... 10-2016-0113240
Sep. 2, 2016   (KR) .......... 10-2016-0113241

(51) Int. Cl.
*G06N 3/08*     (2006.01)
*H01L 43/02*    (2006.01)
(Continued)

(52) U.S. Cl.
CPC ............ *G06N 3/0635* (2013.01); *G06N 3/04* (2013.01); *G06N 3/06* (2013.01); *H01L 43/02* (2013.01);
(Continued)

(58) Field of Classification Search
CPC ....... H01L 43/02; H01L 43/12; G06N 3/0635; G06N 3/06; G06N 3/063; G06N 3/04; G06N 3/08
See application file for complete search history.

(56) References Cited

U.S. PATENT DOCUMENTS

2002/0154538 A1* 10/2002 Inui .................. G11C 11/15
                                                     365/158
2012/0049843 A1*  3/2012 Sun .................. H01L 43/12
                                                     324/249
(Continued)

FOREIGN PATENT DOCUMENTS

KR   10-2014-0104279 A    8/2014
KR   10-2016-0019682 A    2/2016
(Continued)

OTHER PUBLICATIONS

"Energy-Efficient Non-Boolean Computing With Spin Neurons and Resistive Memory" Kaushik Roy et al. IEEE Transactions on Nanotechnology, vol. 13, No. 1, Jan. 2014.
(Continued)

*Primary Examiner* — Caridad Everhart
(74) *Attorney, Agent, or Firm* — NSIP Law

(57) ABSTRACT

The present disclosure provides a neuromorphic device and a method of driving the same. The neuromorphic device of the present disclosure includes a channel, the magnetization direction of which is changed as a plurality of data is integrated, first and second magnetization regulators formed on both ends of the channel and responsible for changing the magnetization direction of the channel according to a plurality of input data, and a controller formed on the channel between the first and second magnetization regulators and responsible for firing data equal to or greater than a critical value integrated in the channel.

18 Claims, 15 Drawing Sheets

(51) Int. Cl.
　　　*H01L 43/12*　　　(2006.01)
　　　*G06N 3/04*　　　(2006.01)
　　　*G06N 3/063*　　　(2006.01)
　　　*H01L 43/08*　　　(2006.01)
　　　*G06N 3/06*　　　(2006.01)
　　　*H01L 43/10*　　　(2006.01)

(52) U.S. Cl.
　　　CPC .............. *H01L 43/08* (2013.01); *H01L 43/10* (2013.01); *H01L 43/12* (2013.01)

(56) References Cited

U.S. PATENT DOCUMENTS

| 2014/0339617 | A1* | 11/2014 | Rhie | H01L 29/78 257/295 |
| 2017/0249981 | A1* | 8/2017 | Nebashi | H01L 29/82 |
| 2017/0249990 | A1* | 8/2017 | Bauer | G11C 13/06 |

FOREIGN PATENT DOCUMENTS

| KR | 10-2016-0056779 A | 5/2016 |
| KR | 10-2018-0026195 A | 3/2018 |
| WO | 2015-016851 A1 | 2/2015 |

OTHER PUBLICATIONS

"Proposal for an All-Spin Artificial Neural Network: Emulating Neural and Synaptic Functionalities Through Domain Wall Motion in Ferromagnets" Abhronil Sengupta, Student Member, IEEE, Yong Shim, and Kaushik Roy, Fellow, IEEE.

* cited by examiner

NEUROMORPHIC DEVICE AND METHOD OF DRIVING THE SAME

CROSS-REFERENCE TO RELATED APPLICATIONS

This application is a National Stage Entry of PCT International Application No. PCT/KR2017/009617, which was filed on Sep. 1, 2017, and which claims priority to Korean Patent Application No. 10-2016-0113240, filed on Sep. 2, 2016, and Korean Patent Application No. 10-2016-0113241, filed on Sep. 2, 2016, in the Korean Intellectual Property Office, the disclosures of each of which are incorporated herein by reference.

TECHNICAL FIELD

The present disclosure relates to a neuromorphic system, and more particularly, to a neuromorphic device for integrating and firing data and a method of driving the same.

In addition, the present disclosure relates to a neuromorphic system, and more particularly, to a neuromorphic device for potentiating and depressing data and a method of driving the same.

BACKGROUND ART

In recent years, attempts have been made to develop a circuit that imitates an animal's nervous system to overcome problems in a von Neumann architecture-based integrated circuit, such as excessive power consumption and heat generation. In particular, techniques that imitate an animal's nervous system may improve cognitive and judgmental capabilities by enabling cognitive and learning functions while significantly reducing power consumption. In addition, such an animal neural network imitation technique may replace or greatly improve the function of a von Neumann architecture-based integrated circuit. Therefore, there is growing interest in such a technique, and research on the technique is being actively conducted.

A neuromorphic system may be implemented using the mechanisms of action of nerve cells. The neuromorphic system refers to a system that imitates the processing of data in the brain by implementing a neuron that constitutes the human brain using a plurality of devices. Thus, using a neuromorphic system including neuron devices, data may be processed and learning may be performed in a manner similar to the brain. That is, a neuron device may be connected to the other neuron device via the synapses of the neuron device and may receive data from the other neuron device via the synapses. In this case, the neuron device integrates (stores) the received data, and outputs the data by firing the data when the data exceeds a critical value ($V_t$). That is, the neuron device has a function of firing and integrating of data. In addition, the synaptic device selectively outputs data according to an input value. That is, the synaptic device potentiates or depresses input data and transmits the data to the neuron device.

Conventionally, the neuron device was fabricated on the basis of C-MOSFETs. A C-MOSFET-based neuron device includes a capacitor responsible for integrating data and a comparator responsible for firing data when a signal above a critical value is applied, and further includes a delay and additional circuits to ensure stability. However, since the capacitor occupies a considerably large volume, the overall size of the neuron device becomes very large, which significantly increases power consumption. Due to these structural limitations, the neuromorphic system has various problems such as complicated configuration and low precision.

In addition, Kaushik Roy et al. proposed that, when an MRAM-based neuron device is used, power consumption may be reduced by 1/100 compared to the C-MOSFET-based neuron device. However, the proposal was based on theoretical calculations, and an MRAM-based neuron device has neither been designed nor fabricated.

In addition, a variety of existing memory-based devices such as flash, SRAM, and DRAM may be used as a synaptic device, but various types of devices, such as phase-change memory (PCM), ferroelectric random access memory (Fe-RAM), and resistive random access memory (ReRAM), are being studied to realize a synaptic device with low power consumption and high integration. However, in the case of the MRAM-based synaptic device, mechanism based on theoretical calculations has been reported, but the structure of the device or a method of driving the device have not been proposed.

Technical Problem

Therefore, the present disclosure has been made in view of the above problems, and it is an objective of the present disclosure to provide a neuromorphic device capable of solving the problems of a C-MOSFET-based neuromorphic device and a method of driving the neuromorphic device.

It is another objective of the present disclosure to provide a neuromorphic device capable of reducing power consumption and improving precision and a method of driving the same.

It is still another objective of the present disclosure to provide a magnetic tunnel junction-based neuromorphic device and a method of driving the same.

Technical Solution

One aspect of the present disclosure provides a neuromorphic device including a channel, the magnetization direction of which is changed as a plurality of data is integrated; first and second magnetization regulators formed on the channel and responsible for changing the magnetization direction of the channel according to a plurality of input data; and a controller formed on the channel between the first and second magnetization regulators and responsible for firing data integrated in the channel.

The channel may include a substrate and a channel layer formed on the substrate and having a magnetic layer.

The channel may further include a buffer layer and a seed layer, which are formed between the substrate and the channel layer, and a separation layer formed on the channel layer.

The magnetization direction of the channel layer may be fixed in one direction in the initial state, and the magnetization direction may be sequentially changed to a direction opposite to the one direction as the data is sequentially input.

The data of the channel may be input/output through the first and second magnetization regulators.

The first and second magnetization regulators may have different magnetization directions.

The first and second magnetization regulators may be formed by laminating a first magnetic layer, a non-magnetic layer, and a second magnetic layer on the channel, respectively, and the first and second magnetic layers may have different thicknesses.

The initial magnetization direction of the channel may be determined by the second magnetization regulator, and the magnetization direction of the channel may be sequentially changed when data is input through the first magnetization regulator.

The data may be integrated in the channel between the first magnetization regulator and the controller.

The controller may include a magnetic tunnel junction in which a free layer, a tunneling barrier, and a fixed layer are laminated; a capping layer formed on the magnetic tunnel junction; and a synthetic exchanged semi-magnetic layer formed on the capping layer and responsible for fixing the magnetization direction of the fixed layer.

In the controller, the magnetization direction of the fixed layer may be fixed and the magnetization direction of the free layer may be changed according to the magnetization direction of the channel layer.

The free layer and the fixed layer may be magnetized in opposite directions in the initial state, and data integrated in the channel may be fired when the free layer and the fixed layer are magnetized in identical directions by magnetization of the channel.

The controller may have a width of ⅕ to ⅒ of a length of the channel between the first and second magnetization regulators.

The amount of integrated data may be adjusted according to at least one of the length of the channel between the first magnetization regulator and the controller, the width of the controller, and the width and height of a pulse applied to input data.

In the channel, data of $2^1$ to $2^{10}$ may be integrated.

Another aspect of the present disclosure provides a neuromorphic device including a channel in which a domain wall is moved as a plurality of data is input and integrated; a first magnetization regulator responsible for moving the domain wall of the channel according to a plurality of input data; a second magnetization regulator having a magnetization direction different from the magnetization direction of the first magnetization regulator and responsible for fixing the magnetization direction of the channel in one direction; and a controller, wherein at least a portion of the controller is coupled to the channel so that the magnetization direction of the controller is changed, and data integrated in the channel is fired when the domain wall passes the bottom of the controller.

At least a portion of each of the channel, the first and second magnetization regulators, and the controller may include a magnetic material.

In the controller, the magnetization direction of a first region may be fixed and the magnetization direction of a second region under the first region may be changed according to the magnetization direction of the channel, and data integrated in the channel may be fired when the magnetization directions of the first and second regions are identical to each other.

Still another aspect of the present disclosure provides a method of driving a neuromorphic device including a step of setting the magnetization direction of a channel so that the magnetization directions of the free layer and the fixed layer of a controller are opposite to each other; a step of sequentially changing the magnetization direction of the channel by sequentially inputting a plurality of data; and a step of firing data integrated in the channel when the magnetization direction of the channel overlapping with the controller is identical to the magnetization direction of the free layer.

The variation width of the magnetization direction of the channel may be adjusted according to at least one of the length of the channel, the width of the controller, and the width and height of a pulse applied to input data.

Yet another aspect of the present disclosure provides a neuromorphic device including a channel, the magnetization direction of which is changed as a plurality of data is potentiated and depressed; first and second magnetization regulators formed on the channel and responsible for changing the magnetization direction of the channel according to a plurality of input data; and a controller formed on the channel between the first and second magnetization regulators and responsible for outputting the data of the channel.

In the channel layer of the channel, the magnetization direction may be changed to a first direction or a second direction opposite to the first direction depending on a direction in which the data is input or the level of the input data.

The data of the channel may be input/output through the first and second magnetization regulators.

The first magnetization regulator may change the magnetization direction of the channel to a first direction according to potentiated data, and the second magnetization regulator may change the magnetization direction of the channel to a second direction opposite to the first direction according to depressed data.

The data may be potentiated and depressed in an area of the channel overlapping with the controller.

The data of the channel may be output in a state wherein the magnetization direction of at least a portion of the free layer of the controller and the magnetization direction of the fixed layer of the controller become equal to each other by magnetization of the channel.

The variation width of a magnetization direction may be adjusted according to at least one of the width of the controller and the width and height of a pulse applied to input the data.

The controller may have a width of ⁶⁄₁₀ to ⁸⁄₁₀ of the length of the channel between the first and second magnetization regulators.

Yet another aspect of the present disclosure provides a neuromorphic device including a channel in which a domain wall is moved as a plurality of data is input and potentiated and depressed; a first magnetization regulator responsible for moving the domain wall of the channel in a first direction according to a plurality of input data; a second magnetization regulator having a magnetization direction different from the magnetization direction of the first magnetization regulator and responsible for moving the domain wall of the channel in a second direction opposite to the first direction according to a plurality of input data; and a controller, wherein at least a portion of the controller is coupled to the channel so that the magnetization direction of the controller is changed and the data of the channel is output.

In the channel, the moving direction of the domain wall may be changed according to a direction in which data is input or the level of the input data.

The moving distance of the domain wall may be adjusted according to at least one of the width of the controller and the width and height of a pulse applied to input the data.

Yet another aspect of the present disclosure provides a method of driving a neuromorphic device including a step of setting the magnetization direction of a channel so that the magnetization directions of the free layer and the fixed layer of a controller are opposite to each other; a step of sequentially changing the magnetization direction of the channel to a first direction by sequentially inputting a plurality of first data; a step of sequentially changing the magnetization direction of the channel to a second direction opposite to the first direction by sequentially inputting a plurality of second data; and a step of outputting data stored in the channel according to the control signal of the controller.

The variation width of the magnetization direction of the channel may be adjusted according to at least one of the width of the controller and the width and height of a pulse applied to input data.

The first and second data may be data having different potentials input in identical directions or data having identical potentials input in different directions.

Advantageous Effects

The neuromorphic device according to embodiments of the present disclosure can be implemented based on MRAM. That is, a neuromorphic device having a laminated structure composed of magnetic materials and a magnetic tunnel junction structure can be fabricated. In the neuromorphic device, a magnetization direction is changed using the laminated structure and the magnetic tunnel junction structure and a domain wall is moved accordingly, so that data is integrated (potentiated) and fired. Therefore, compared to existing devices (e.g., C-MOSFET-based neuromorphic devices), the neuromorphic device of the present disclosure enables reduction in energy consumption and high integration. In addition, when the neuromorphic device of the present disclosure is used to implement a neuromorphic system, development of artificial intelligence capable of performing learning and logical thinking before data processing can be promoted.

MODES OF THE DISCLOSURE

Hereinafter, preferred embodiments of the present disclosure will be described in detail with reference to the accompanying drawings. However, the present disclosure may be embodied in many different forms and should not be construed as limited to the embodiments set forth herein. Rather, these embodiments are provided so that this disclosure will be thorough and complete, and will fully convey the scope of the disclosure to those skilled in the art.

Hereinafter, a neuromorphic device according to one embodiment of the present disclosure will be described with reference to FIGS. 1 to 14.

Figure 1:
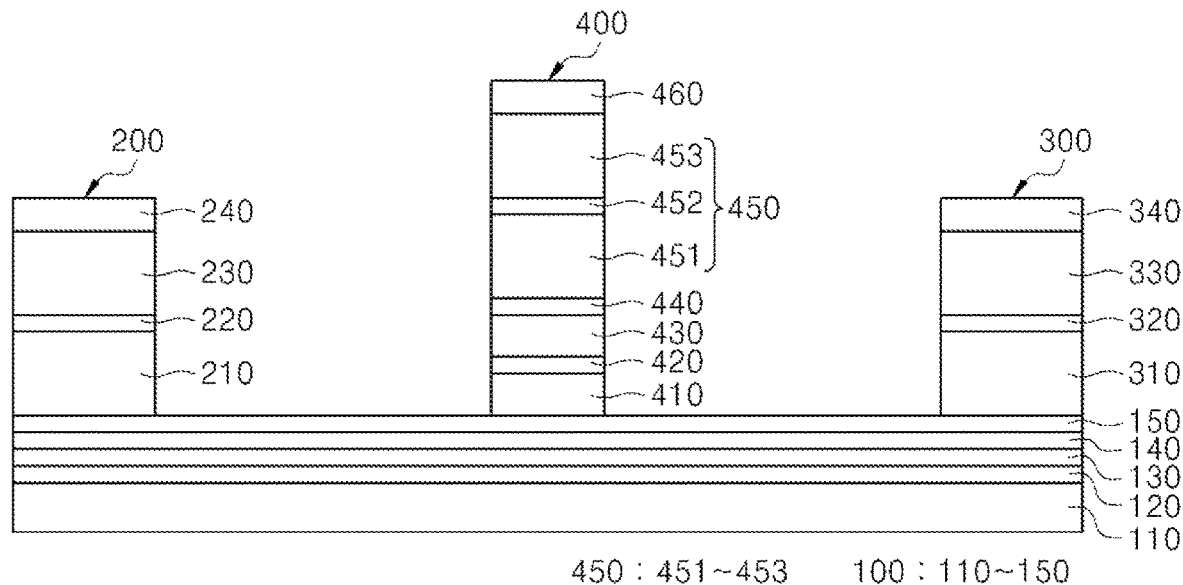
FIG. 1 is a cross-sectional view of a neuromorphic device according to one embodiment of the present disclosure.
Figure 2:
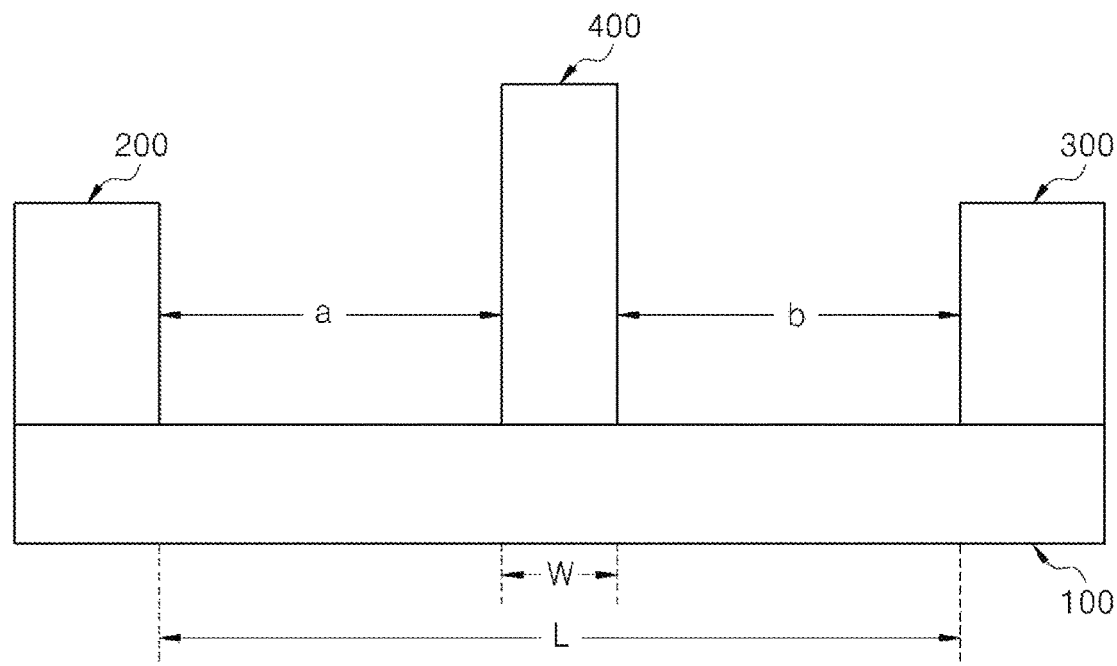
FIG. 2 is a schematic cross-sectional view of a neuromorphic device according to one embodiment of the present disclosure.

FIG. 1 is a cross-sectional view of a neuromorphic device according to one embodiment of the present disclosure, and FIG. 2 is a schematic cross-sectional view of the neuromorphic device.

Referring to FIGS. 1 and 2, the magnetization direction of a neuromorphic device according to one embodiment of the present disclosure may be changed according to input data, and the neuromorphic device may include a channel 100 responsible for integrating a plurality of data, first and second magnetization regulators 200 and 300 formed on both ends of the channel 100 and responsible for fixing the initial magnetization direction of the channel 100 and inputting/outputting data, and a controller 400 formed on the channel 100 between the first and second magnetization regulators 200 and 300 and responsible for outputting data integrated in the channel 100 when the data is greater than or equal to a critical value ($V_{th}$).

In the channel 100, the magnetization direction is fixed by the first and second magnetization regulators 200 and 300, and is sequentially changed when a plurality of data is input, and the data is integrated accordingly. That is, in the channel 100, as the magnetization direction is sequentially changed, a domain wall is moved in the direction in which the magnetization direction is changed, and data is integrated accordingly. In this case, the domain wall is the boundary between magnetizations with different directions and is moved in one direction when the magnetization direction of the channel 100 is changed as data is integrated. The magnetization directions of the first and second magnetization regulators 200 and 300 are different from each other, and the first and second magnetization regulators 200 and 300 fix the magnetization direction of the channel 100 in one direction in the initial state. In addition, data is input to the channel 100 through any one of the first and second magnetization regulators 200 and 300, and the data integrated in the channel 100 is output through the other of the first and second magnetization regulators 200 and 300 under control of the controller 400. In this case, when data is input through any one of the first and second magnetization regulators 200 and 300, the magnetization direction of the channel 100 is changed. At least a part of the controller 400 is coupled to the magnetization of the channel 100 so that the magnetization direction thereof is changed. When the data integrated in the channel 100 is equal to or greater than a critical value, the magnetization direction of the controller 400 is changed, and the data integrated in the channel 100 is output. That is, when the magnetization direction of one region of the channel 100 overlapping with the controller 400 and the magnetization direction of a region adjacent to the one region are the same, the controller 400 may output the data integrated in the channel 100. Therefore, according to the neuromorphic device of the present disclosure, the channel 100 functions to integrate data, and the controller 400 functions to fire the data integrated in the channel 100. Thus, the neuromorphic device may operate as a basic neuromorphic device (for example, neuron).

1. Channel

The channel 100 integrates data input through any one of the first and second magnetization regulators 200 and 300. In this case, in an initial state before data is input, that is, in the reset state, the magnetization direction of the channel 100 is fixed by the first and second magnetization regulators 200 and 300 and is changed according to input data. As the magnetization direction is changed, a domain wall may be moved in one direction. For example, in the initial state, the magnetization direction of the channel 100 is the same as the magnetization direction of the second magnetization regulator 300. Then, the magnetization direction of the channel 100 is sequentially changed to the magnetization direction of the first magnetization regulator 200 as input data is integrated, and a domain wall is moved in one direction accordingly. Therefore, in the channel 100, the amount of data to be integrated may be determined depending on the width of the channel region. In addition, in the channel 100, the amount of data to be integrated may be determined depending on the width (w) of the controller 400. In this case, when data is input through the first magnetization regulator 200, as shown in FIG. 2, the width of a channel region in which data is integrated may be defined as a distance (a) between the first magnetization regulator 200 and the controller 400. The channel 100 may be formed on a substrate 110, and may include a channel layer 140, the magnetization direction of which is changed according to input data. In addition, the channel 100 may further include a buffer layer 120 and a seed layer 130 formed between the substrate 110 and the channel layer 140 and a separation layer 150 formed on the channel layer 140.

A semiconductor substrate may be used as the substrate 110. For example, as the substrate 110, silicon substrates, gallium arsenide substrates, silicon germanium substrates, silicon oxide film substrates, and the like may be used. In this embodiment, a silicon substrate is used. An insulating layer may be formed on the substrate 110. The insulating layer may be formed using an amorphous silicon oxide ($SiO_2$) film or the like. That is, a semiconductor substrate on which an insulating layer formed using a silicon oxide film is formed may be used as the substrate 110.

The buffer layer 120 and the seed layer 130 may be formed under the channel layer 140 to form vertical magnetization in the channel layer 140. That is, the magnetization direction is preferably clearly changed according to input data. For this purpose, the buffer layer 120 and the seed layer 130 may be formed so that the channel layer 140 has vertical magnetization. The buffer layer 120 may be formed using tantalum (Ta), and for example, may be formed to have a thickness of 2 nm to 10 nm. The seed layer 130 may be formed using a polycrystalline material, such as magnesium oxide (MgO), aluminum oxide ($Al_2O_3$), silicon oxide ($SiO_2$), tantalum oxide ($Ta_2O_5$), silicon nitride (SiNx), or aluminum nitride (AlNx). Preferably, the seed layer 130 may be formed using magnesium oxide, and for example, may be formed to have a thickness of 1 nm to 1.5 nm. When the seed layer 130 is formed in this manner, the crystallinity of the channel layer 140 formed thereon may be improved. In addition, the crystallinity of the first and second magnetization regulators 200 and 300 and the crystallinity of the controller 400 may be improved. That is, when the seed layer 130 is formed using a polycrystalline material, the amorphous channel layer 140 and the laminated structures 200, 300, and 400 formed on the seed layer 130 grow in the crystal orientation of the seed layer 130.

The magnetization direction of the channel layer 140 is changed depending on data input through any one of the first and second magnetization regulators 200 and 300, and a domain wall is moved accordingly. That is, the magnetization direction of the channel layer 140 is not fixed, but may be changed from one direction to the opposite direction. That is, the magnetization direction of the channel layer 140 may be changed from the direction toward the substrate 110 (i.e., downward direction) to the direction toward the laminate (i.e., upward direction). Conversely, the magnetization direction of the channel layer 140 may be changed from the direction toward the laminate to the direction toward the substrate 110. Therefore, when data is repeatedly input through any one of the first and second magnetization regulators 200 and 300, the magnetization direction of the channel layer 140 is sequentially changed, and a domain wall is moved accordingly. Through this process, a plurality of data is integrated. For example, the channel layer 140 may be magnetized in the downward direction in the initial state, that is, in the reset state, and the magnetization direction of the channel layer 140 may be changed by a predetermined width in the direction from the first magnetization regulator 200 toward the controller 400 according to data input through the first magnetization regulator 200. Accordingly, a domain wall is moved toward the controller 400. The channel layer 140 may be formed of a ferromagnetic substance. For example, the channel layer 140 may be formed using a ferromagnetic substance, such as Full-Heusler semimetal-based alloys, amorphous rare-earth element alloys, multilayer thin films formed by alternately laminating a magnetic metal and a non-magnetic metal, alloys having an L10-type crystal structure, and cobalt-based alloys. Full-Heusler semimetal-based alloys include CoFeAl, CoFeAlSi, and the like, and the amorphous rare-earth element alloys include TbFe, TbCo, TbFeCo, DyTbFeCo, and GdTbCo alloys. In addition, the multilayer thin films formed by alternately laminating a magnetic metal and a non-magnetic metal include Co/Pt, Co/Pd, CoCr/Pt, Co/Ru, Co/Os, Co/Au, Ni/Cu, CoFeAl/Pd, CoFeAl/Pt, CoFeB/Pd, CoFeB/Pt, and the like. In addition, the alloys having an L10-type crystal structure include Fe50Pt50, Fe50Pd50, Co50Pt50, Fe30Ni20Pt50, Co30Ni20Pt50, and the like. In addition, the cobalt-based alloys include CoCr, CoPt, CoCrPt, CoCrTa, CoCrPtTa, CoCrNb, CoFeB, and the like. Of these materials, a CoFeB monolayer may be formed thicker than a multilayer structure of CoFeB and Co/Pt or Co/Pd, and may be more easily etched than metals such as Pt and Pd. Thus, compared with the multilayer structure containing Co/Pt or Co/Pd, the CoFeB monolayer may be more easily prepared. Therefore, in one embodiment of the present disclosure, the channel layer 140 may be formed using the CoFeB monolayer. In this case, CoFeB may be formed in an amorphous structure and then textured into BCC (100) by heat treatment.

The separation layer 150 is formed on the channel layer 140 to magnetically separate the channel 100 and the first and second magnetization regulators 200 and 300 from each other. That is, when the separation layer 150 is formed, the magnetization of the first and second magnetization regulators 200 and 300 and the magnetization of the channel layer 140 are generated independently of each other. In addition, the separation layer 150 may couple the channel 100 and at least a part of the controller 400 to each other. That is, the controller 400 may be formed in a magnetic tunnel junction (MTJ) structure. The separation layer 150 may be formed to couple the free layer of the magnetic tunnel junction and the channel layer 140 to adjust the magnetization direction of the free layer. The separation layer 150 may be formed of a material allowing crystal growth of the first and second magnetization regulators 200 and 300 and the controller 400. That is, the separation layer 150 allows the first and second magnetization regulators 200 and 300 and the controller 400 to grow in a desired crystal orientation. For example, the separation layer 150 may be formed of a metal that facilitates crystal growth in the (111) direction of the face-centered cubic (FCC) lattice or in the (001) direction of the hexagonal close-packed (HCP) structure. The separation layer 150 may include a metal selected from the group consisting of tantalum (Ta), ruthenium (Ru), titanium (Ti), palladium (Pd), platinum (Pt), magnesium (Mg), cobalt (Co), aluminum (Al), and tungsten (W) or an alloy thereof. For example, the separation layer 150 may be formed of at least one of tantalum (Ta) and tungsten (W). That is, the separation layer 150 may be formed of tantalum (Ta) or tungsten (W), or in a laminated structure of Ta/W. In one embodiment of the present disclosure, the separation layer 150 is formed of tantalum. In addition, the separation layer 150 may be formed to have a thickness of 0.3 nm to 0.6 nm. In this case, when Ta is used, the separation layer 150 may be formed to have a thickness of 0.4 nm to 0.6 nm. When W is used, the separation layer 150 may be formed to have a thickness of 0.35 nm to 0.55 nm.

2. First and Second Magnetization Regulators

The first and second magnetization regulators 200 and 300 are formed at both ends of the channel 100 to be spaced apart from each other. That is, the first and second magnetization regulators 200 and 300 may be formed to have a predetermined length in the direction of the channel 100 from both ends of the channel 100, and may be formed to have a predetermined width in a direction orthogonal to the direction of the channel 100. In this case, the first and second magnetization regulators 200 and 300 may be formed to have the same length and width, and may have a length and width of 5 nm or less. For example, the first and second magnetization regulators 200 and 300 may be formed to have a length and width of 1 nm to 5 nm, and may have the same length and width, or either one may be larger or smaller. In addition, the first and second magnetization regulators 200 and 300 are formed so that the magnetization directions thereof are opposite to each other. For example, the first magnetization regulator 200 is magnetized in the downward direction (i.e., the direction toward the substrate 110), and the second magnetization regulator 300 is magnetized in the upward direction. In addition, any one of the first and second magnetization regulators 200 and 300 inputs data, and the other outputs data. That is, any one of the first and second magnetization regulators 200 and 300 injects electrons into the channel layer 140, and the other outputs the electrons integrated in the channel layer 140. For example, the first magnetization regulator 200 inputs data to integrate data in the channel layer 140, and the second magnetization regulator 300 outputs the data integrated in the channel layer 140. In the initial state, i.e., in the reset state, the first and second magnetization regulators 200 and 300 may allow the channel 100 to be magnetized in the magnetization direction of the second magnetization regulator 300, i.e., in the upward direction, and may allow the channel 100 to be sequentially magnetized in the downward direction according to data repeatedly input through the first magnetization regulator 200.

The first and second magnetization regulators 200 and 300 may be formed to have the same structure. For example, the first magnetization regulator 200 may be formed by laminating a first magnetic layer 210, a first non-magnetic layer 220, a second magnetic layer 230, and a first electrode 240, and the second magnetization regulator 300 may be formed by laminating a third magnetic layer 310, a second non-magnetic layer 320, a fourth magnetic layer 330, and a second electrode 340. In this case, the first and second magnetic layers 210 and 230 are antiferromagnetically coupled via the first non-magnetic layer 220, and the third and fourth magnetic layers 310 and 330 are antiferromagnetically coupled via the second non-magnetic layer 320. In addition, the magnetization directions of the first and second magnetic layers 210 and 230 are arranged antiparallel to each other, and the magnetization directions of the third and fourth magnetic layers 310 and 330 are also arranged antiparallel to each other. For example, the first magnetic layer 210 may be magnetized in the downward direction (i.e., the direction toward the substrate 110), and the second magnetic layer 230 may be magnetized in the upward direction (i.e., the direction toward the first electrode 240). On the other hand, the third magnetic layer 310 may be magnetized in the upward direction (i.e., the direction toward the second electrode 340), and the fourth magnetic layer 330 may be magnetized in the downward direction (i.e., the direction toward the substrate 110). Therefore, the first magnetization regulator 200 may fix the magnetization direction of the channel 100 in the downward direction or change the magnetization direction of the channel 100 in the downward direction, and the second magnetization regulator 300 may fix the magnetization direction of the channel 100 in the upward direction or change the magnetization direction of the channel 100 in the upward direction.

The first and second magnetic layers 210 and 230 and the third and fourth magnetic layers 310 and 330 may be formed by alternately laminating a magnetic metal and a non-magnetic metal, respectively. A single metal selected from the group consisting of iron (Fe), cobalt (Co), and nickel (Ni) or an alloy thereof may be used as the magnetic metal, and a single metal selected from the group consisting of chromium (Cr), platinum (Pt), palladium (Pd), iridium (Ir), rhodium (Rh), ruthenium (Ru), osmium (Os), rhenium (Re), gold (Au), and copper (Cu) or an alloy thereof may be used as the non-magnetic metal. For example, the first and second magnetic layers 210 and 230 and the third and fourth magnetic layers 310 and 330 may be formed of $[Co/Pd]_n$, $[Co/Pt]_n$, or $[CoFe/Pt]_n$ (n being an integer of 1 or more), respectively. Preferably, the first and second magnetic layers 210 and 230 and the third and fourth magnetic layers 310 and 330 are formed of $[Co/Pt]_n$, and the magnetization directions thereof are perpendicular. Thus, each of the first and third magnetic layers 210 and 310 and the channel layer 140 are coupled to each other via the separation layer 150, so that the magnetization direction of the channel layer 140 becomes equal to the magnetization direction of the first and second magnetization regulators 200 and 300. In addition, in the first and second magnetization regulators 200 and 300 formed of $[Co/Pt]_n$, the number of repetitions of [Co/Pt] and the order of deposition may be changed so that the magnetization directions of the first and second magnetization regulators 200 and 300 are opposite to each other to change the magnetization direction in the channel 100. For example, the number of repetitions of [Co/Pt] in the first magnetic layer 210 may be smaller than the number of repetitions of [Co/Pt] in the third magnetic layer 310, and the number of repetitions of [Co/Pt] in the second magnetic layer 230 may be larger than the number of repetitions of [Co/Pt] in the fourth magnetic layer 330, so that the magnetization directions are opposite to each other. That is, the number of repetitions of [Co/Pt] in the first magnetic layer 210 may be smaller than the number of repetitions of [Co/Pt] in the second magnetic layer 230, and the number of repetitions of [Co/Pt] in the third magnetic layer 310 may be larger than the number of repetitions of [Co/Pt] in the fourth magnetic layer 330, so that the magnetization directions of these magnetic layers are different from each other. For example, the first magnetic layer 210 may be formed of $[Co/Pt]_3$, and the second magnetic layer 230 may be formed of $[Co/Pt]_6$, so that the first magnetic layer 210 is magnetized in the downward direction and the second magnetic layer 230 is magnetized in the upward direction. In addition, the third magnetic layer 310 may be formed of $[Co/Pt]_6$, and the fourth magnetic layer 330 may be formed of $[Co/Pt]_3$, so that the third magnetic layer 310 is magnetized in the upward direction and the fourth magnetic layer 330 is magnetized in the downward direction. Therefore, the first magnetization regulator 200 may be magnetized in the downward direction, and the second magnetization regulator 300 may be magnetized in the upward direction.

The first non-magnetic layer 220 is formed between the first and second magnetic layers 210 and 230, and the second non-magnetic layer 320 is formed between the third and fourth magnetic layers 310 and 330. The first and second non-magnetic layers 220 and 320 are formed of a non-magnetic material allowing for the first and second magnetic layers 210 and 230 and the third and fourth magnetic layers 310 and 330 to be semi-magnetically coupled to each other, respectively. For example, the first and second non-magnetic layers 220 and 320 may be formed of one selected from the group consisting of ruthenium (Ru), rhodium (Rh), osmium (Os), rhenium (Re), and chromium (Cr) or an alloy thereof.

In addition, the first and second electrodes 240 and 340 are formed on the second and fourth magnetic layers 230 and 330, respectively. The first and second electrodes 240 and 340 may be connected to the outside to input/output data from/to the outside. That is, electrons may be injected or output through the first and second electrodes 240 and 340. The first and second electrodes 240 and 340 may be formed using a conductive material such as metals, metal oxides, and metal nitrides. For example, the first and second electrodes 240 and 340 may be formed of a single metal selected from the group consisting of tantalum (Ta), ruthenium (Ru), titanium (Ti), palladium (Pd), platinum (Pt), magnesium (Mg), and aluminum (Al) or an alloy thereof.

3. Controller

The controller 400 is formed on the channel 100 between the first and second magnetization regulators 200 and 300. The controller 400 may be formed to have a narrower width than the widths of the first and second magnetization regulators 200 and 300 in the longitudinal direction of the channel 100. When data equal to or greater than a critical value is integrated in the channel 100, the controller 400 outputs the data. That is, the controller 400 may amplify current to a greater extent than current applied to the channel 100, and may output the current. For example, the controller 400 may be formed to have a width (w) corresponding to ⅕ to ¹⁄₁₀ of the length (L) of the channel 100 to determine the critical value of current amplification according to movement of the domain wall. The controller 400 is coupled to the region of the channel 100 overlapping with the controller 400 so that the magnetization direction is changed. After data is integrated in a set amount, the controller 400 and the channel 100 have the same magnetization direction, and data is output. In addition, the number of data integration times in the channel 100, i.e., the amount of integrated data, may be determined by the width of the controller 400 and the distance between the first magnetization regulator 200 and the controller 400. That is, as shown in FIG. 2, assuming that the length of the channel 100 between the first and second magnetization regulators 200 and 300, i.e., the channel length, is L, the distance between the first magnetization regulator 200 and the controller 400 is a, the distance between the controller 400 and the second magnetization regulator 300 is b, and the width of the controller 400 is w, an equation of L=a+b+w is satisfied. In this case, a is $2^1$w to $2^{10}$w. In this case, the width (w) of the controller 400 should be determined so that the free layer of a vertical magnetic tunnel junction may be switched by one input pulse. In addition, when data is input once through the first magnetization regulator 200, the magnetization direction is changed by the width of the controller 400 and a domain wall is moved by the width of the controller 400 accordingly. Thus, the amount of data to be integrated may be determined depending on the width (w) of the controller 400 and the distance (a) between the first magnetization regulator 200 and the controller 400. Therefore, the neuromorphic device according to the present disclosure may integrate data of $2^1$ to $2^{10}$ in the channel 100. That is, data of $2^1$ to $2^{10}$ may be integrated in the channel 100, in which data is substantially integrated, between the first magnetization regulator 200 and the controller 400. In addition, data to be integrated in the channel 100 may be adjusted depending on the width and height of a pulse applied through the first magnetization regulator 200. That is, as the pulse width or the pulse height decreases, the number of integrated data increases. On the contrary, as the pulse width or the pulse height increases, the number of integrated data decreases. In this case, the pulse width may be 10 ns or less, and the pulse height, i.e., voltage, may be less than 1 V. In addition, the neuromorphic device may be driven by voltage as described above, and may also be driven by current. When the neuromorphic device is driven by current, current of 2 mA or less may be applied.

The controller 400 may be formed in a magnetic tunnel junction structure. That is, the controller 400 may include a magnetic tunnel junction in which a free layer 410, a tunneling barrier 420, and a fixed layer 430 are laminated. In addition, the controller 400 may further include a capping layer 440, a synthetic exchanged semi-magnetic layer 450, and a third electrode 460, which are formed on the magnetic tunnel junction. The synthetic exchanged semi-magnetic layer 450 may include a fifth magnetic layer 451, a third non-magnetic layer 452, and a sixth magnetic layer 453. In particular, the free layer 410 is separated from the fixed layer 430 by the tunneling barrier 420, and is separated from the channel layer 140, which is located under the free layer 410, by the separation layer 150 to be coupled with the magnetization direction of the channel layer 140. Therefore, the magnetization direction of the free layer 410 may be changed according to the magnetization direction of the channel layer 140. Accordingly, a tunnel magnetoresistance ratio (TMR) is exhibited according to a state in which the magnetization directions of the fixed layer 430 and the free layer 410 are parallel (RP) or anti-parallel (RAP). Current may be amplified, i.e., fired, when changing from an anti-parallel state to a parallel state.

The free layer 410 may be formed on the separation layer 150. The magnetization direction of the free layer 410 may not be fixed and may be changed from one direction to the opposite direction. That is, the magnetization direction of the free layer 410 may be the same (i.e., parallel) as the magnetization direction of the fixed layer 430, or may be opposite (i.e., antiparallel) to the magnetization direction of the fixed layer 430. In addition, the free layer 410 may be coupled to the channel layer 140 by the separation layer 150 so that the magnetization direction of the free layer 410 may be changed according to the magnetization direction of the channel layer 140. Therefore, when the magnetization direction of the free layer 410 is the same as the magnetization direction of the fixed layer 430 according to the magnetization direction of the channel layer 140, data integrated in the channel layer 140 may be amplified and output. That is, when data is integrated in the channel layer 140 a predetermined number of times and the magnetization direction of the channel layer 140 under the controller 400 is changed so that the magnetization direction of the free layer 410 becomes the same as the magnetization direction of the fixed layer 430, data integrated in the channel layer 140 is output through the second magnetization regulator 300. The free layer 410 is formed of a ferromagnetic substance, such as Full-Heusler semimetal-based alloys, amorphous rare-earth element alloys, multilayer thin films formed by alternately laminating a magnetic metal and a non-magnetic metal, alloys having an L10-type crystal structure, and cobalt-based alloys. Full-Heusler semimetal-based alloys include CoFeAl, CoFeAlSi, and the like, and the amorphous rare-earth element alloys include TbFe, TbCo, TbFeCo, DyTbFeCo, and GdTbCo alloys. In addition, the multilayer thin films formed by alternately laminating a magnetic metal and a non-magnetic metal include Co/Pt, Co/Pd, CoCr/Pt, Co/Ru, Co/Os, Co/Au, Ni/Cu, CoFeAl/Pd, CoFeAl/Pt, CoFeB/Pd, CoFeB/Pt, and the like. In addition, the alloys having an L10-type crystal structure include Fe50Pt50, Fe50Pd50, Co50Pt50, Fe30Ni20Pt50, Co30Ni20Pt50, and the like. In addition, the cobalt-based alloys include CoCr, CoPt, CoCrPt, CoCrTa, CoCrPtTa, CoCrNb, CoFeB, and the like. Of these materials, a CoFeB monolayer may be formed thicker than a multilayer structure of CoFeB and Co/Pt or Co/Pd. Thus, when the CoFeB monolayer is used, the magnetoresistance ratio may be increased. In addition, CoFeB may be more easily etched than metals such as Pt and Pd. Thus, compared with a multilayer structure containing Co/Pt or Co/Pd, the CoFeB monolayer may be more easily prepared. Therefore, in one embodiment of the present disclosure, the free layer 410 is formed using a CoFeB monolayer. In this case, CoFeB is formed in an amorphous structure and then textured into BCC (100) by heat treatment.

The tunneling barrier 420 is formed on the free layer 410 to separate the free layer 410 and the fixed layer 430 from each other. The tunneling barrier 420 enables quantum mechanical tunneling between the free layer 410 and the fixed layer 430. The tunneling barrier 420 may be formed of magnesium oxide (MgO), aluminum oxide ($Al_2O_3$), silicon oxide ($SiO_2$), tantalum oxide ($Ta_2O_5$), silicon nitride (SiNx), aluminum nitride (AlNx), or the like. In one embodiment of the present disclosure, the tunneling barrier 420 is formed using polycrystalline magnesium oxide. Then, magnesium oxide is textured into BCC (100) by heat treatment.

The fixed layer 430 is formed on the tunneling barrier 420. The magnetization direction of the fixed layer 430 may be fixed in one direction in a magnetic field within a predetermined range, and the fixed layer 430 may be formed of a ferromagnetic substance. For example, the magnetization direction may be fixed in the direction from top to bottom. For example, the fixed layer 430 may be formed of a ferromagnetic substance such as Full-Heusler semimetal-based alloys, amorphous rare-earth element alloys, multilayer thin films formed by alternately laminating a magnetic metal and a non-magnetic metal, and alloys having an L10-type crystal structure. In this case, the fixed layer 430 may be formed of the same ferromagnetic substance as the free layer 410, and is preferably formed of a CoFeB monolayer.

The capping layer 440 is formed on the fixed layer 430 to magnetically separate the fixed layer 430 and the synthetic exchanged semi-magnetic layer 450 from each other. When the capping layer 440 is formed, the magnetization of the synthetic exchanged semi-magnetic layer 450 and the magnetization of the fixed layer 430 are generated independently of each other. In addition, the capping layer 440 may be formed in consideration of the magnetoresistance ratio of the free layer 410 and the fixed layer 430 for operation of a magnetic tunnel junction. The capping layer 440 may be formed of a material allowing crystal growth of the synthetic exchanged semi-magnetic layer 450. That is, the capping layer 440 allows the synthetic exchanged semi-magnetic layer 450 to grow in a crystal orientation. For example, the capping layer 440 may be formed of a metal that facilitates crystal growth in the (111) direction of the face-centered cubic (FCC) lattice or in the (001) direction of the hexagonal close-packed (HCP) structure. The capping layer 440 may include a metal selected from the group consisting of tantalum (Ta), ruthenium (Ru), titanium (Ti), palladium (Pd), platinum (Pt), magnesium (Mg), cobalt (Co), aluminum (Al), and tungsten (W) or an alloy thereof. Preferably, the capping layer 440 is formed of at least one of tantalum (Ta) and tungsten (W). That is, the capping layer 440 may be formed of tantalum (Ta) or tungsten (W), or in a laminated structure of Ta/W. In one embodiment of the present disclosure, the capping layer 440 is formed of tantalum. In addition, the capping layer 440 may be formed to have a thickness of 0.3 nm to 0.6 nm. When Ta is used, the capping layer 440 may be formed to have a thickness of 0.4 nm to 0.6 nm. When W is used, the capping layer 440 may be formed to have a thickness of 0.35 nm to 0.55 nm.

The synthetic exchanged semi-magnetic layer 450 is formed on the capping layer 440. The synthetic exchanged semi-magnetic layer 450 serves to fix the magnetization of the fixed layer 430. The synthetic exchanged semi-magnetic layer 450 includes the fifth magnetic layer 451, a sixth non-magnetic layer 452, and the sixth magnetic layer 453. In the synthetic exchanged semi-magnetic layer 450, the fifth and sixth magnetic layers 451 and 453 are antiferromagnetically coupled to each other via the third non-magnetic layer 452. In this case, the magnetization directions of the fifth and sixth magnetic layers 451 and 453 are arranged antiparallel to each other. For example, the fifth magnetic layer 451 may be magnetized in the downward direction (i.e., the direction toward the substrate 110), and the sixth magnetic layer 453 may be magnetized in the upward direction (i.e., the direction toward the third electrode 460). The fifth and sixth magnetic layers 451 and 453 may be formed by alternately laminating a magnetic metal and a non-magnetic metal. A single metal selected from the group consisting of iron (Fe), cobalt (Co), and nickel (Ni) or an alloy thereof may be used as the magnetic metal, and a single metal selected from the group consisting of chromium (Cr), platinum (Pt), palladium (Pd), iridium (Ir), rhodium (Rh), ruthenium (Ru), osmium (Os), rhenium (Re), gold (Au), and copper (Cu) or an alloy thereof may be used as the non-magnetic metal. For example, the fifth and sixth magnetic layers 451 and 453 may be formed of $[Co/Pd]_n$, $[Co/Pt]_n$, or $[CoFe/Pt]_n$ (n being an integer of 1 or more). The third non-magnetic layer 452 is formed between the fifth and sixth magnetic layers 451 and 453, and is formed of a non-magnetic material that allows the fifth and sixth magnetic layers 451 and 453 to be semi-magnetically coupled to each other. For example, the third non-magnetic layer 452 may be formed of a single metal selected from the group consisting of ruthenium (Ru), rhodium (Rh), osmium (Os), rhenium (Re), and chromium (Cr) or an alloy thereof.

In addition, the third electrode 460 is formed on the sixth magnetic layer 453. The third electrode 460 may be formed using a conductive material such as metals, metal oxides, and metal nitrides. For example, the third electrode 460 may be formed of a single metal selected from the group consisting of tantalum (Ta), ruthenium (Ru), titanium (Ti), palladium (Pd), platinum (Pt), magnesium (Mg), and aluminum (Al) or an alloy thereof.

As described above, in a neuromorphic device according to one embodiment of the present disclosure, the first and second magnetization regulators 200 and 300 are provided on the channel 100 such that the first and second magnetization regulators 200 and 300 are spaced apart from each other by a predetermined distance, and the controller 400 including a magnetic tunnel junction is provided between the first and second magnetization regulators 200 and 300. In the neuromorphic device, the first and second magnetization regulators 200 and 300 are magnetized in opposite directions to each other, and the magnetization direction of the channel 100 is set so that the magnetization directions of the free layer 410 and the fixed layer 430 of the controller 400 are opposite to each other in the initial state. For example, when a predetermined current pulse, i.e., data, is input through the first magnetization regulator 200, the magnetization direction of the channel 100 is changed by the width of the controller 400 and a domain wall is moved toward the controller 400 accordingly. In this manner, a plurality of predetermined current pulses, i.e., a plurality of data, is applied and integrated in the channel 100. After a plurality of data is input, the magnetization direction of the channel 100 under the controller 400 is changed, so that the magnetization direction of the free layer 410 becomes the same as the magnetization direction of the fixed layer 430. Then, a plurality of data integrated in the channel 100 is output through the second magnetization regulator 300. That is, current is amplified, i.e., fired, and output by the controller 400. In addition, when a predetermined amount of current is applied between the first and second magnetization regulators 200 and 300, the magnetization direction of the channel 100 is changed to the magnetization direction of the second magnetization regulator 300 to be reset to the initial state.

In addition, the following structure was fabricated to confirm the magnetic properties of the first and second magnetization regulators of a neuromorphic device according to one embodiment of the present disclosure. That is, a buffer layer of Ta, a seed layer of MgO, a channel layer of $Co_2Fe_6B_2$, a separation layer of Ta, lower magnetic layers of [Co/Pt], a non-magnetic layer of Ru, upper magnetic layers of [Co/Pt], and an electrode were laminated on a $SiO_2$ substrate. In this case, the buffer layer of Ta, the seed layer of MgO, the channel layer of $Co_2Fe_6B_2$, and the separation layer of Ta formed on the $SiO_2$ substrate correspond to the channel 100. In addition, the lower magnetic layers correspond to the first and third magnetic layers of the first and second magnetization regulators, respectively, and the upper magnetic layers correspond to the second and fourth magnetic layers of the first and second magnetization regulators, respectively. In this case, the first and second magnetization regulators were formed in the same manner, except that the thicknesses of the lower and upper magnetic layers were different. That is, in the first magnetization regulator, the first magnetic layer was formed of $[Co/Pt]_3$, and the second magnetic layer was formed of $[Co/Pt]_6$. In the second magnetization regulator, the third magnetic layer was formed of $[Co/Pt]_6$, and the fourth magnetic layer was formed of $[Co/Pt]_3$. That is, the first and second magnetic layers of the first magnetization regulator were formed by repeating [Co/Pt] three times and six times, respectively. The third and fourth magnetic layers of the second magnetization regulator were formed by repeating [Co/Pt] six times and three times, respectively. In this case, the monolayer of [Co/Pt] was composed of 0.4 nm thick Co and 0.3 nm thick Pt.

Figure 3:
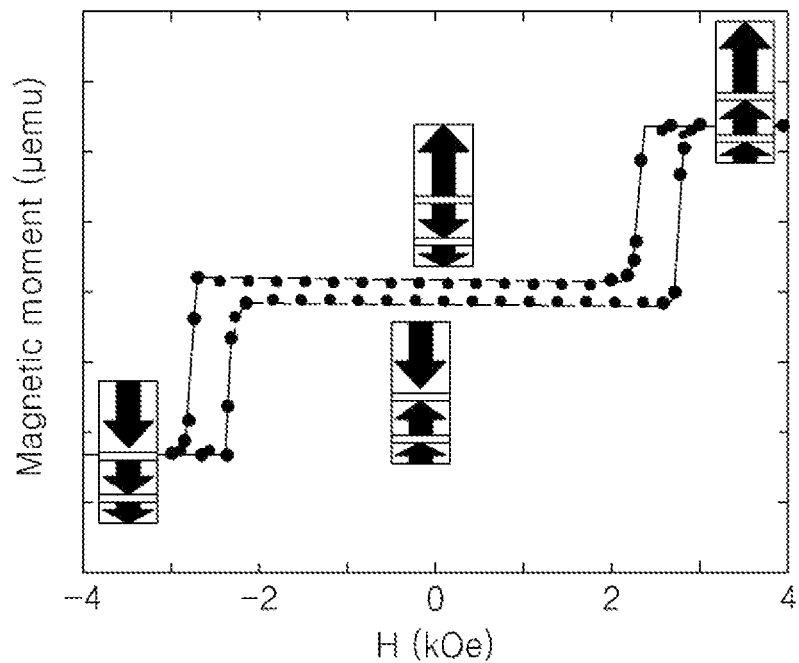
FIGS. 3 and 4 are graphs showing the magnetization properties of the first and second magnetization regulators of a neuromorphic device according to one embodiment of the present disclosure.
Figure 4:
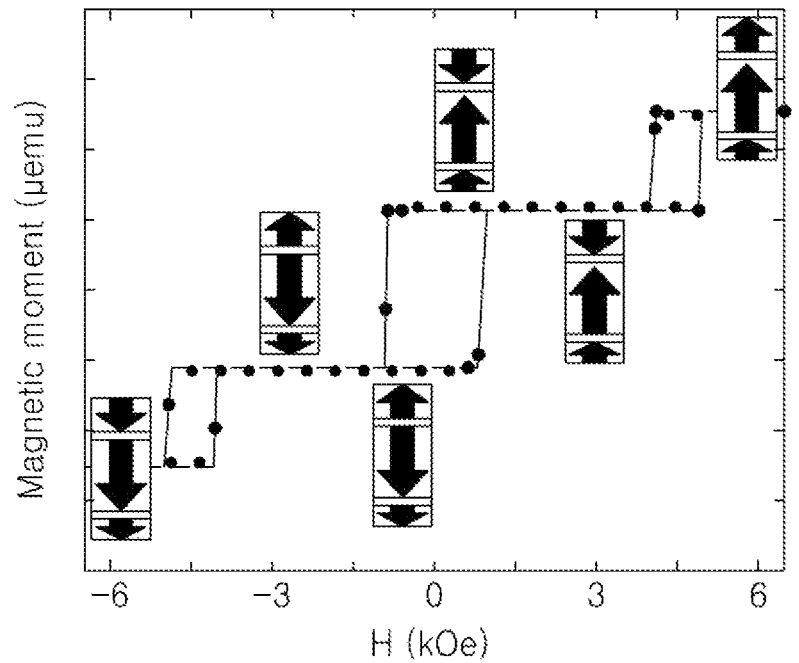

FIGS. 3 and 4 are graphs showing the magnetization properties and magnetization directions of the first and second magnetization regulators depending on external magnetic fields. As shown in FIGS. 3 and 4, the first and second magnetization regulators have three arrows, i.e., three magnetization directions. In order from top to bottom, the first arrow indicates the magnetization direction of the upper magnetic layers (i.e., the second and fourth magnetic layers), the second arrow indicates the magnetization direction of the lower magnetic layers (i.e., the first and third magnetic layers), and the third arrow indicates the magnetization direction of the channel layer. As shown in FIG. 3, in the first magnetization regulator, the magnetization direction of the channel layer is fixed downward in accordance with the magnetization direction of the first magnetic layer in an equilibrium state in which there is no external magnetic field, that is, at 0 kOe. However, as shown in FIG. 4, in contrast to the first magnetization regulator, in the second magnetization regulator, the magnetization direction of the channel layer is fixed upward in accordance with the magnetization direction of the third magnetic layer in an equilibrium state in which there is no external magnetic field.

As described above, in the neuromorphic device of the present disclosure, the first and second magnetization regulators may be magnetized in different directions, and the magnetization direction of the channel layer may be changed accordingly.

In addition, the following structure was fabricated to confirm the magnetization properties of the controller of a neuromorphic device according to one embodiment of the present disclosure. That is, a buffer layer of Ta, a seed layer of MgO, a channel layer of $Co_2Fe_6B_2$, a separation layer of Ta, a free layer of CoFeB, a tunneling barrier of MgO, a fixed layer of CoFeB, a capping layer of Ta, a fifth magnetic layer of [Co/Pt], a third non-magnetic layer of Ru, a sixth magnetic layer of [Co/Pt], and an electrode were laminated on a $SiO_2$ substrate. In this case, the buffer layer of Ta, the seed layer of MgO, the channel layer of $Co_2Fe_6B_2$, and the separation layer of Ta formed on the $SiO_2$ substrate correspond to the channel 100, and the free layer of CoFeB, the tunneling barrier of MgO, and the fixed layer of CoFeB correspond to the magnetic tunnel junction structure, and the fifth magnetic layer of [Co/Pt], the third non-magnetic layer of Ru, and the sixth magnetic layer of [Co/Pt] correspond to the synthetic exchanged semi-magnetic layer. In addition, the fifth magnetic layer was formed of $[Co/Pt]_3$, and the sixth magnetic layer was formed of $[Co/Pt]_6$. That is, the fifth magnetic layer was formed by repeating [Co/Pt] three times, and the sixth magnetic layer was formed by repeating [Co/Pt] six times. In addition, the fifth magnetic layer may be formed of $[Co/Pt]_6$, and the sixth magnetic layer may be formed of $[Co/Pt]_3$. The seed layer of MgO promotes formation of the vertical spin direction of the channel layer of $Co_2Fe_6B_2$, and serves as an insulating film that prevents current from leaking to the bottom, and the tunneling barrier of MgO generates a tunnel magnetoresistance ratio according to the magnetization directions of the free layer of $Co_2Fe_6B_2$ and the fixed layer.

Figure 5A:
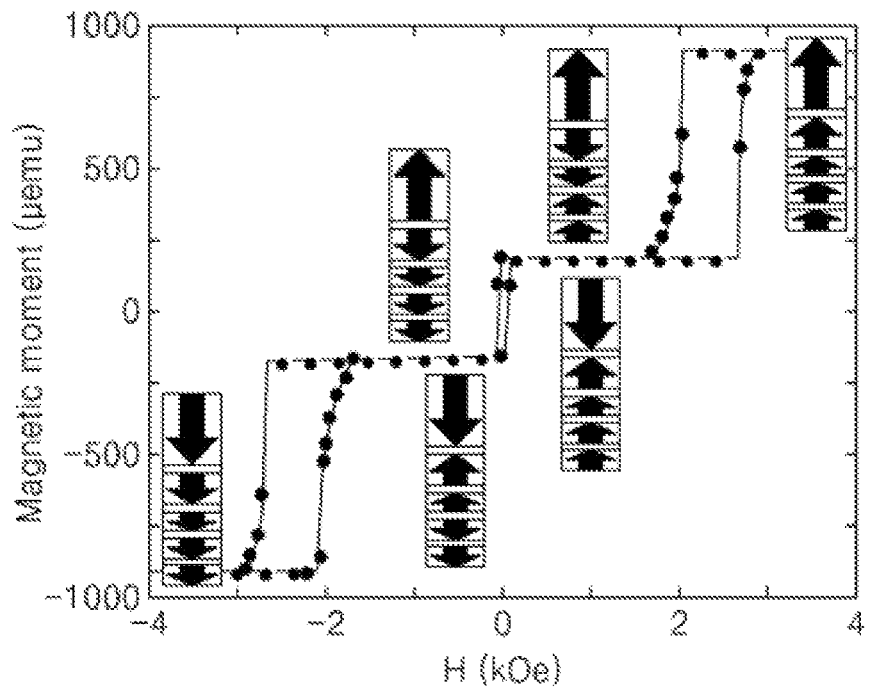
FIGS. 5A and 5B include graphs showing the magnetization properties of the controller of a neuromorphic device according to one embodiment of the present disclosure.
Figure 5B:
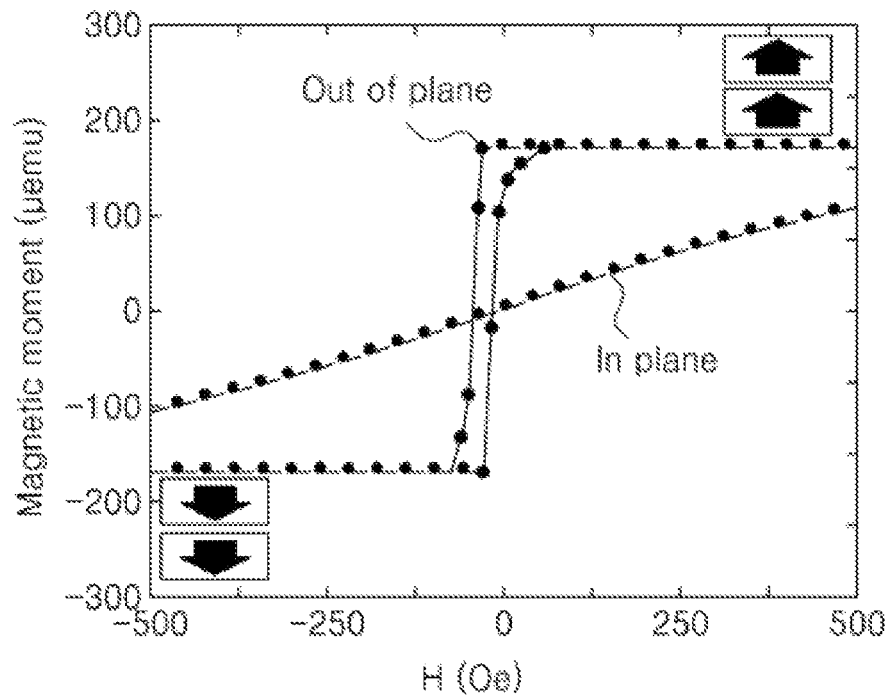

FIG. 5A is a graph showing the magnetization properties and magnetization directions of the controller depending on external magnetic fields. As shown in FIG. 5A, in order from top to bottom, the arrows indicate the magnetization directions of the sixth magnetic layer, the fifth magnetic layer, the fixed layer, the free layer, and the channel layer, respectively. When the graph showing the magnetic properties is enlarged in the range of −500 Oe to +500 Oe, as shown in FIG. 5B, as the external magnetic field changes from + to − or from − to +, the free layer and the channel layer are coupled to each other by the separation layer of Ta. Thus, the magnetization directions of the free layer and the channel layer are always changed to the same direction. In this case, the magnetization direction of the fixed layer is not changed by the fifth magnetic layer, but is fixed.

As described above, in the neuromorphic device of the present disclosure, the free layer of the controller is coupled to the channel layer and the magnetization direction of the free layer is changed according to the magnetization direction of the channel layer.

A method of driving the neuromorphic device according to one embodiment of the present disclosure is described as follows. FIGS. 6 to 13 are schematic diagrams for explaining the method of driving the neuromorphic device according to one embodiment of the present disclosure, and show the magnetization directions of the channel 100, the first and second magnetization regulators 200 and 300, and the controller 400 according to data input (i.e., electron injection). In this case, the magnetization direction of the first magnetization regulator 200 is fixed in the downward direction, and the magnetization direction of the second magnetization regulator 300 is fixed in the upward direction. Data is input through the first magnetization regulator 200, and data is output through the second magnetization regulator 300. In addition, in the controller 400, the lower side is the magnetization direction of the free layer, and the upper side is the magnetization direction of the fixed layer, and the magnetization direction of the fixed layer is fixed in the downward direction by the synthetic exchanged semi-magnetic layer. In addition, FIG. 14 shows voltage pulses input and current output at each step when the neuromorphic device is driven. In this case, FIG. 14 shows current detected through a second magnetization fixing portion when a read voltage of 0.1 V is applied to the controller. In this case, current detected in a unit area, i.e., 1 $cm^2$, is shown. In this embodiment, a case wherein six pieces of data are input and integrated in the channel is explained.

Figure 6:
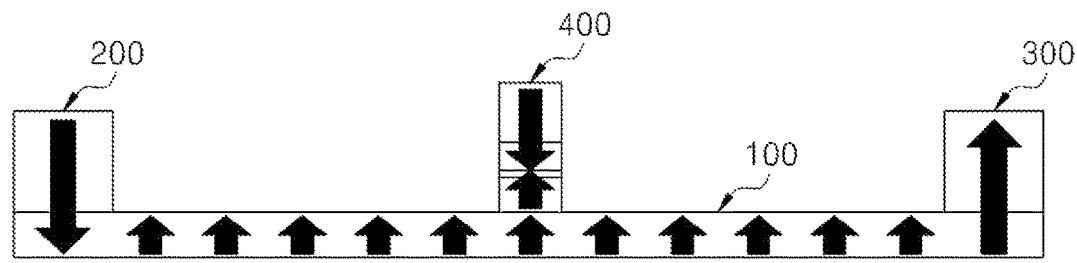
FIGS. 6 to 13 are schematic diagrams for explaining a method of driving a neuromorphic device according to one embodiment of the present disclosure.

Referring to FIGS. 6 and 14, electrons are injected from the second magnetization regulator 300 to the first magnetization regulator 200 to reset the magnetization direction of the channel 100 (①in FIG. 14). Accordingly, the magnetization direction of the channel 100 is fixed in the upward direction according to the magnetization direction of the second magnetization regulator 300. In this case, as shown in FIG. 14, when a read signal is applied through the controller 400, a low level of current is detected through the second magnetization regulator 300.

Figure 7:
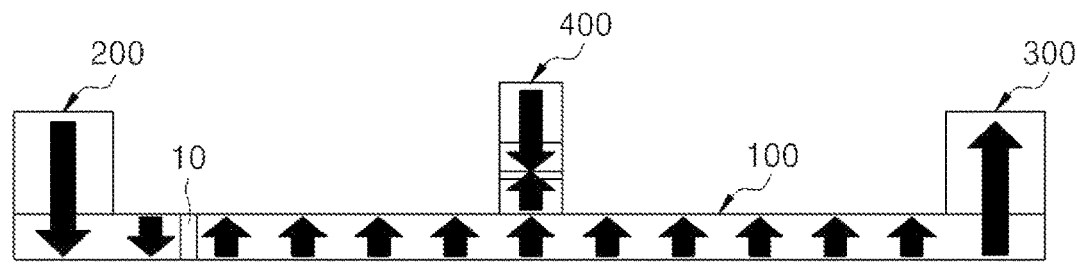

Referring to FIGS. 7 and 14, for example, a pulse signal of 0.2 V is applied through the first magnetization regulator 200 so that electrons are injected into the channel 100 once (②in FIG. 14). That is, data is input to the channel 100 once through the first magnetization regulator 200. Therefore, the magnetization direction of the channel 100 is partially changed. That is, the magnetization direction of the channel 100 is changed to the downward direction through the first magnetization regulator 200. In this case, a domain wall 10 is the domain between magnetization in the downward direction and magnetization in the upward direction, and the domain wall is moved toward the controller 400 as the magnetization direction is changed. In this case, as shown in FIG. 14, when a read signal is applied through the controller 400, a low level of current is detected through the second magnetization regulator 300.

Figure 8:
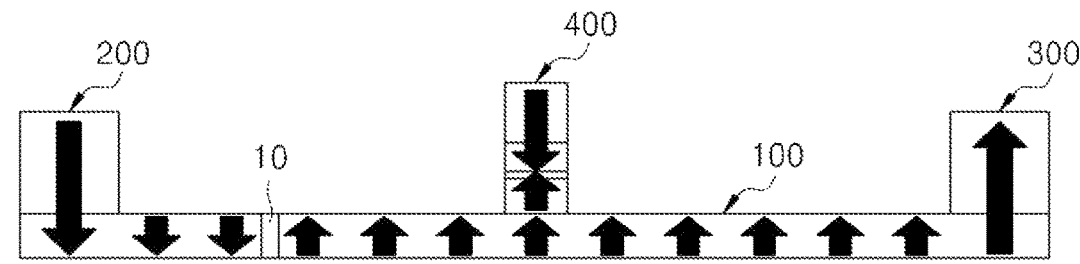
Figure 9:
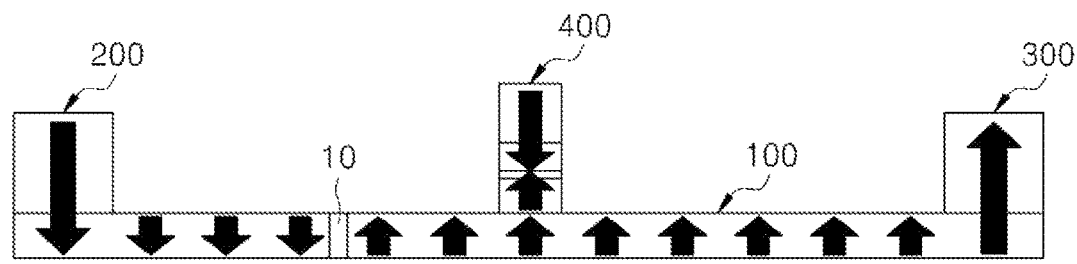
Figure 10:
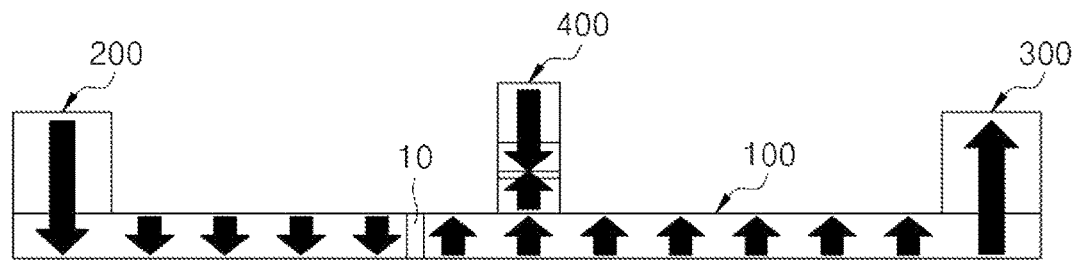
Figure 11:
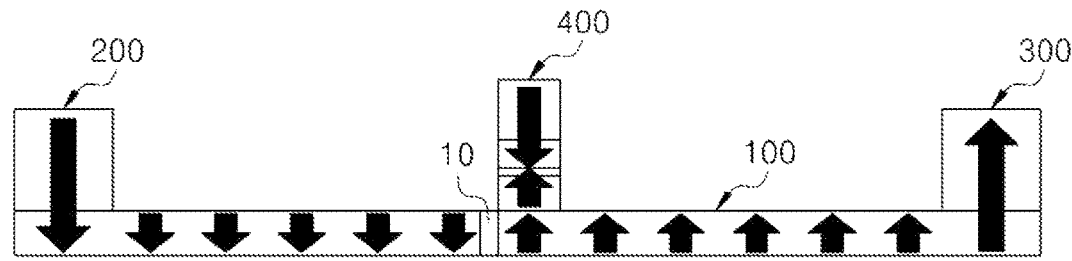

Referring to FIGS. 8 and 14, for example, a pulse signal of 0.2 V is applied through the first magnetization regulator 200 so that electrons are injected to the channel 100 twice (③in FIG. 14). That is, data is input to the channel 100 through the first magnetization regulator 200 twice and integrated. Therefore, the magnetization direction of the channel 100 is changed again in the downward direction. That is, the magnetization direction is changed to a wider width than in the first data input. In this case, as shown in FIG. 14, when a read signal is applied through the controller 400, a low level of current is detected through the second magnetization regulator 300.

Referring to FIGS. 9 to 11 and FIG. 14, for example, a pulse signal of 0.2 V may be repeatedly applied five times through the first magnetization regulator 200 (④, ⑤, ⑥in FIG. 14). Therefore, data may be input to the channel 100 five times and integrated. Accordingly, the magnetization direction of the channel 100 may be sequentially changed to the direction toward the controller 400 and a domain wall may also be moved. However, as shown in FIG. 14, when a read signal is applied through the controller 400 in this state, a low level of current is detected through the second magnetization regulator 300.

Figure 12:
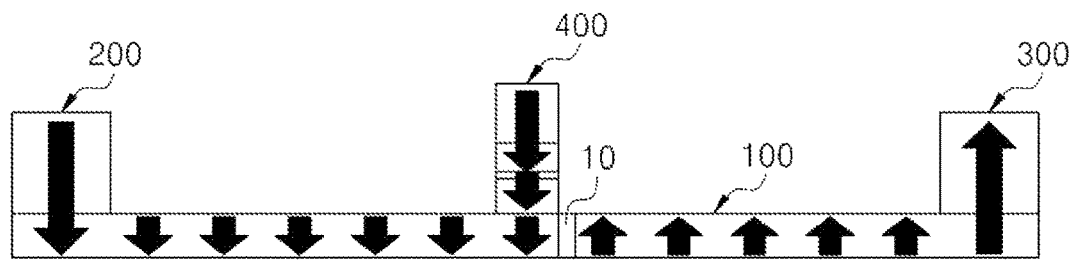

Referring to FIGS. 12 and 14, for example, when a pulse signal of 0.2 V is applied six times through the first magnetization regulator 200, the magnetization direction of the channel 100 under the controller 400 is changed to the downward direction, and the magnetization direction of the free layer is changed to the downward direction accordingly (⑦in FIG. 14). That is, the free layer is coupled to the channel under the free layer so that the magnetization direction of the free layer may be changed. When the magnetization direction of the channel 100 under the free layer is changed to the downward direction, the magnetization direction of the free layer may also be changed to the downward direction. When the magnetization direction of the free layer is changed to the downward direction, an equilibrium state in which the magnetization directions of the fixed layer and the free layer are the same is maintained. Accordingly, as shown in FIG. 14, data integrated in the channel 100 is fired. That is, current applied to the channel 100 may be amplified and output.

Figure 13:
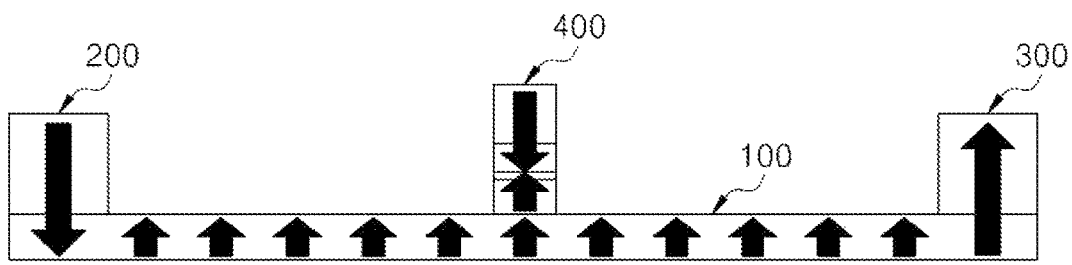
Figure 14:
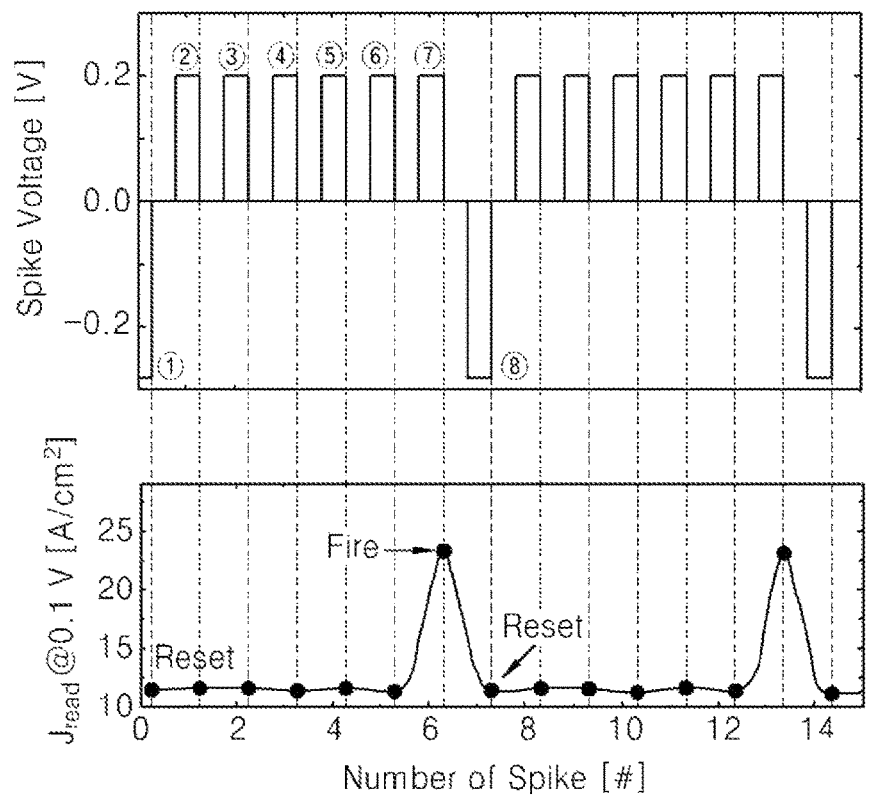
FIG. 14 includes graphs showing input and output waveforms when a neuromorphic device according to one embodiment of the present disclosure is driven.

Referring to FIGS. 13 and 14, after a plurality of data is integrated into the channel 100 and fired, a predetermined amount of current is applied from the second magnetization regulator 300, so that the magnetization direction of the channel 100 is changed to the downward direction to be reset (⑧in FIG. 14).

Hereinafter, a neuromorphic device according to another embodiment of the present disclosure will be described with reference to FIGS. 15 to 35.

Since some of the components of a neuromorphic device according to another embodiment of the present disclosure are the same as those of the neuromorphic device according to one embodiment of the present disclosure, description of the same components will be omitted.

Figure 15:
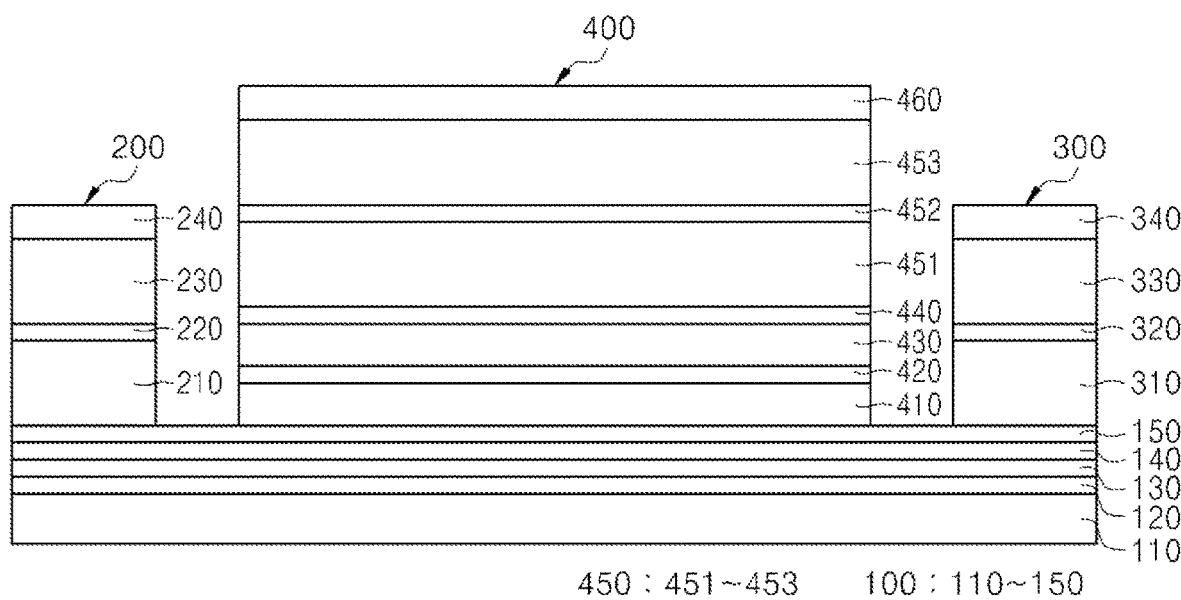
FIG. 15 is a cross-sectional view of a neuromorphic device according to another embodiment of the present disclosure.
Figure 16:
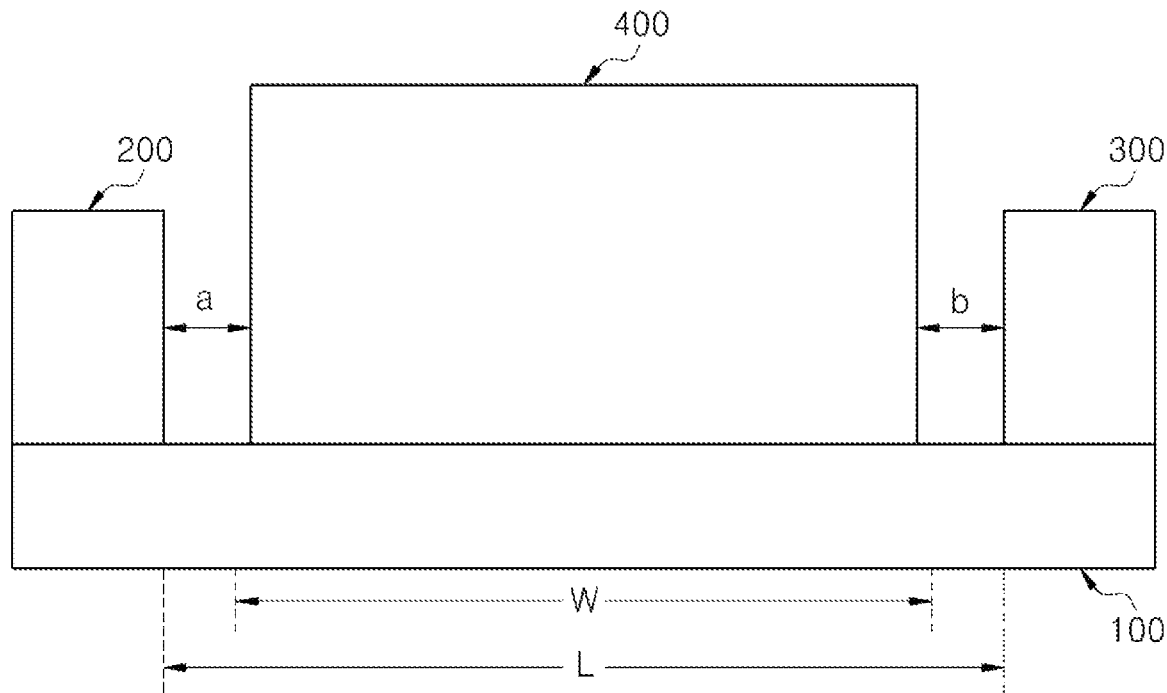
FIG. 16 is a schematic cross-sectional view of a neuromorphic device according to another embodiment of the present disclosure.

FIG. 15 is a cross-sectional view of a neuromorphic device according to another embodiment of the present disclosure, and FIG. 16 is a schematic cross-sectional view of the neuromorphic device.

Referring to FIGS. 15 and 16, the magnetization direction of a neuromorphic device according to another embodiment of the present disclosure may be changed according to input data, and the neuromorphic device may include the channel 100 responsible for storing a plurality of data, the first and second magnetization regulators 200 and 300 formed on both ends of the channel 100 and responsible for inputting/outputting data to the channel 100, and the controller 400 formed on the channel 100 between the first and second magnetization regulators 200 and 300 and responsible for selectively outputting data stored in the channel 100.

The initial magnetization direction of the channel 100 may be fixed by any one of the first and second magnetization regulators 200 and 300, and the magnetization direction of the channel 100 may be changed according to data input through the first and second magnetization regulators 200 and 300. For example, in the initial state, the magnetization direction of the channel 100 may be directed upward according to the magnetization direction of the second magnetization regulator 300. Then, the magnetization direction of the channel 100 may be sequentially changed downward by a plurality of data input through the first magnetization regulator 200, and the magnetization direction of the channel 100 may be sequentially changed upward by a plurality of data input through the second magnetization regulator 300. Therefore, in the channel 100, as the magnetization direction of the channel 100 is moved downward according to the magnetization direction of the first magnetization regulator 200, data is potentiated. On the other hand, as the magnetization direction of the channel 100 is moved upward according to the magnetization direction of the second magnetization regulator 300, data is depressed. In this case, as data is potentiated, a domain wall moves toward the second magnetization regulator 300. On the other hand, as data is depressed, a domain wall moves toward the first magnetization regulator 200. In this case, the domain wall is the boundary between magnetizations with different directions. When data is potentiated, the domain wall may move in one direction. When data is depressed, the domain may move in the other direction. Therefore, as the magnetization direction is moved and the domain wall moves accordingly, data may be potentiated or depressed.

The magnetization directions of the first and second magnetization regulators 200 and 300 are different from each other, and the first and second magnetization regulators 200 and 300 fix the magnetization direction of the channel 100 in one direction in the initial state. In addition, data is input to the channel 100 through any one of the first and second magnetization regulators 200 and 300 and data is potentiated, and the data of the channel 100 is depressed through the other one of the first and second magnetization regulators 200 and 300. For example, the data of the channel 100 is potentiated by a plurality of data input through the first magnetization regulator 200, and the data of the channel 100 is depressed by a plurality of data input through the second magnetization regulator 300.

The controller 400 outputs the data of the channel 100, the magnetization direction of which is changed as data is potentiated or depressed. That is, the controller 400 outputs current corresponding to the position of the domain wall of the channel 100, the magnetization direction of which is changed as data is potentiated or depressed. In addition, at least a portion of the controller 400 overlapping with the channel 100 is coupled to the channel 100 so that the magnetization direction may be changed, and the controller 400 outputs data potentiated or depressed according to the variation width of the magnetization direction of the channel 100. In this case, the amount of potentiated data may be adjusted according to the length of the region of the controller 400 overlapping with the channel 100. For this purpose, the controller 400 is preferably formed as long as possible while being spaced apart from the first and second magnetization regulators 200 and 300. For example, the controller 400 may be formed to have a length of about 6/10 to 8/10 of the length of the channel 100.

Therefore, in the neuromorphic device according to the present disclosure, the channel 100 stores data by potentiating and depressing data, and the controller 400 outputs the data. Therefore, the neuromorphic device may operate as a basic neuromorphic device (e.g., a synapse).

1. Channel

The magnetization direction of the channel 100 is fixed by the first and second magnetization regulators 200 and 300, and the channel 100 stores data input through the first and second magnetization regulators 200 and 300. That is, the initial magnetization direction of the channel 100 may be fixed by any one of the first and second magnetization regulators 200 and 300, and the magnetization direction of the channel 100 may be changed according to data input through the first and second magnetization regulators 200 and 300. For example, the magnetization direction of the channel 100 may be directed upward according to the magnetization direction of the second magnetization regulator 300, may be sequentially changed downward by a plurality of data input through the first magnetization regulator 200, and may be sequentially changed upward by a plurality of data input through the second magnetization regulator 300. That is, when a plurality of positive pulses is applied through the first magnetization regulator 200, the magnetization direction of the channel 100 may be sequentially changed downward, and when a plurality of negative pulses is applied through the first magnetization regulator 200, the magnetization direction changed downward may be sequentially changed upward again. Therefore, in the channel 100, as the magnetization direction of the channel 100 is moved downward according to the magnetization direction of the first magnetization regulator 200, data is potentiated. On the other hand, as the magnetization direction of the channel 100 is moved upward according to the magnetization direction of the second magnetization regulator 300, data is depressed. In this case, when a positive pulse is applied, a domain wall moves toward the second magnetization regulator 300. On the other hand, when a negative pulse is applied, a domain wall moves toward the first magnetization regulator 200. Accordingly, data may be potentiated and depressed by moving a domain wall. In this case, the domain wall is the boundary between magnetizations with different directions. When data is potentiated, the domain wall may move in one direction. When data is depressed, the domain wall may move in the other direction.

The channel 100 may be formed on the substrate 110 and may include the channel layer 140, the magnetization direction of which is changed according to input data. In addition, the channel 100 may further include the buffer layer 120 and the seed layer 130, which are formed between the substrate 110 and the channel layer 140, and the separation layer 150 formed on the channel layer 140.

A semiconductor substrate may be used as the substrate 110. That is, a semiconductor substrate on which an insulating layer such as a silicon oxide film is formed may be used as the substrate 110.

The buffer layer 120 and the seed layer 130 may be formed under the channel layer 140 to form vertical magnetization in the channel layer 140. That is, the magnetization direction is preferably clearly changed according to input data. For this purpose, the buffer layer 120 and the seed layer 130 may be formed so that the channel layer 140 has vertical magnetization. When the seed layer 130 is formed in this manner, the crystallinity of the channel layer 140 formed thereon may be improved. In addition, the crystallinity of the first and second magnetization regulators 200 and 300 and the crystallinity of the controller 400 may be improved. That is, when the seed layer 130 is formed using a polycrystalline material, the amorphous channel layer 140 and the laminated structures 200, 300, and 400 formed on the seed layer 130 grow in the crystal orientation of the seed layer 130.

The magnetization direction of the channel layer 140 is changed depending on data input through any one of the first and second magnetization regulators 200 and 300, and a domain wall is moved accordingly. That is, the magnetization direction of the channel layer 140 is not fixed, but may be changed from one direction to the opposite direction. That is, the magnetization direction of the channel layer 140 may be changed from the direction toward the substrate 110 (i.e., downward direction) to the direction toward the laminate (i.e., upward direction). Conversely, the magnetization direction of the channel layer 140 may be changed from the direction toward the laminate to the direction toward the substrate 110. Therefore, when data is repeatedly input through any one of the first and second magnetization regulators 200 and 300, the magnetization direction of the channel layer 140 is sequentially changed, and a domain wall is moved accordingly. Through this process, a plurality of data is stored. For example, the channel layer 140 may be magnetized in the downward direction in the initial state, that is, in the reset state, and the magnetization direction of the channel layer 140 may be changed by a predetermined width in the direction from the first magnetization regulator 200 toward the controller 400 according to data input through the first magnetization regulator 200. Accordingly, a domain wall is moved toward the controller 400. The channel layer 140 may be formed of a ferromagnetic substance. Therefore, in another embodiment of the present disclosure, the channel layer 140 may be formed using a CoFeB monolayer. In this case, CoFeB may be formed in an amorphous structure and then textured into BCC (100) by heat treatment.

The separation layer 150 is formed on the channel layer 140 to magnetically separate the channel 100 and the first and second magnetization regulators 200 and 300 from each other. That is, when the separation layer 150 is formed, the magnetization of the first and second magnetization regulators 200 and 300 and the magnetization of the channel layer 140 are generated independently of each other. In addition, the separation layer 150 may couple the channel 100 and at least a part of the controller 400 to each other. That is, the controller 400 may be formed in a magnetic tunnel junction (MTJ) structure. The separation layer 150 may be formed to couple the free layer of the magnetic tunnel junction and the channel layer 140 to adjust the magnetization direction of the free layer. The separation layer 150 may be formed of a material allowing crystal growth of the first and second magnetization regulators 200 and 300 and the controller 400. That is, the separation layer 150 allows the first and second magnetization regulators 200 and 300 and the controller 400 to grow in a desired crystal orientation. For example, the separation layer 150 may be formed of a metal that facilitates crystal growth in the (111) direction of the face-centered cubic (FCC) lattice or in the (001) direction of the hexagonal close-packed (HCP) structure. In another embodiment of the present disclosure, the separation layer 150 is formed of tantalum. In addition, the separation layer 150 may be formed to have a thickness of 0.3 nm to 0.6 nm. In this case, when Ta is used, the separation layer 150 may be formed to have a thickness of 0.4 nm to 0.6 nm. When W is used, the separation layer 150 may be formed to have a thickness of 0.35 nm to 0.55 nm.

2. First and Second Magnetization Regulators

The first and second magnetization regulators 200 and 300 are formed at both ends of the channel 100 to be spaced apart from each other. The first and second magnetization regulators 200 and 300 are formed so that the magnetization directions thereof are opposite to each other. For example, the first magnetization regulator 200 is magnetized in the downward direction (i.e., the direction toward the substrate 110), and the second magnetization regulator 300 is magnetized in the upward direction. In addition, the first and second magnetization regulators 200 and 300 fix the magnetization direction of the channel 100 in one direction in the initial state. For example, in the initial state, the magnetization direction of the channel 100 may be fixed downward according to the magnetization direction of the second magnetization regulator 300. In addition, data is input to the channel 100 through any one of the first and second magnetization regulators 200 and 300 and data is potentiated, and the data of the channel 100 is depressed through the other one of the first and second magnetization regulators 200 and 300. For example, the data of the channel 100 is potentiated by a plurality of data input through the first magnetization regulator 200, and the data of the channel 100 is depressed by a plurality of data input through the second magnetization regulator 300. That is, when a positive pulse is applied through the first magnetization regulator 200, the magnetization direction of the channel 100 is changed downward according to the magnetization direction of the first magnetization regulator 200 so that data is potentiated. When a negative pulse is applied through the first magnetization regulator 200, the magnetization direction of the channel 100 is changed upward according to the magnetization direction of the second magnetization regulator 300 so that data is depressed. In this case, in the case that a positive pulse is applied, a positive potential having a predetermined width and voltage may be applied to the first magnetization regulator 200 and the second magnetization regulator 300 may be in a ground state. In the case that a negative pulse is applied, a negative potential having a predetermined width and voltage may be applied to the first magnetization regulator 200 and the second magnetization regulator 300 may be in a ground state. In addition, in the case that a positive pulse is applied, the first magnetization regulator 200 may be grounded and a negative potential having a predetermined width and voltage may be applied to the second magnetization regulator 300. In the case that a negative pulse is applied, the first magnetization regulator 200 may be grounded and a positive potential having a predetermined width and voltage may be applied to the second magnetization regulator 300. In addition, the first and second magnetization regulators 200 and 300 may be formed to have a width of, e.g., 5 nm or less.

The first and second magnetization regulators 200 and 300 may be formed to have the same structure. For example, the first magnetization regulator 200 may be formed by laminating the first magnetic layer 210, the first non-magnetic layer 220, the second magnetic layer 230, and the first electrode 240, and the second magnetization regulator 300 may be formed by laminating the third magnetic layer 310, the second non-magnetic layer 320, the fourth magnetic layer 330, and the second electrode 340. In this case, the first and second magnetic layers 210 and 230 are antiferromagnetically coupled via the first non-magnetic layer 220, and the third and fourth magnetic layers 310 and 330 are antiferromagnetically coupled via the second non-magnetic layer 320. In addition, the magnetization directions of the first and second magnetic layers 210 and 230 are arranged antiparallel to each other, and the magnetization directions of the third and fourth magnetic layers 310 and 330 are also arranged antiparallel to each other. For example, the first magnetic layer 210 may be magnetized in the downward direction (i.e., the direction toward the substrate 110), and the second magnetic layer 230 may be magnetized in the upward direction (i.e., the direction toward the first electrode 240). On the other hand, the third magnetic layer 310 may be magnetized in the upward direction (i.e., the direction toward the second electrode 340), and the fourth magnetic layer 330 may be magnetized in the downward direction (i.e., the direction toward the substrate 110). Therefore, the first magnetization regulator 200 may fix the magnetization direction of the channel 100 in the downward direction or change the magnetization direction of the channel 100 in the downward direction, and the second magnetization regulator 300 may fix the magnetization direction of the channel 100 in the upward direction or change the magnetization direction of the channel 100 in the upward direction.

The first and second magnetic layers 210 and 230 and the third and fourth magnetic layers 310 and 330 may be formed by alternately laminating a magnetic metal and a non-magnetic metal, respectively. Preferably, the first and second magnetic layers 210 and 230 and the third and fourth magnetic layers 310 and 330 are formed of $[Co/Pt]_n$, and the magnetization directions thereof are perpendicular. Thus, each of the first and third magnetic layers 210 and 310 and the channel layer 140 are coupled to each other via the separation layer 150, so that the magnetization direction of the channel layer 140 becomes equal to the magnetization direction of the first and second magnetization regulators 200 and 300. In addition, in the first and second magnetization regulators 200 and 300 formed of $[Co/Pt]_n$, the number of repetitions of [Co/Pt] and the order of deposition may be changed so that the magnetization directions of the first and second magnetization regulators 200 and 300 are opposite to each other to change the magnetization direction in the channel 100. For example, the number of repetitions of [Co/Pt] in the first magnetic layer 210 may be smaller than the number of repetitions of [Co/Pt] in the third magnetic layer 310, and the number of repetitions of [Co/Pt] in the second magnetic layer 230 may be larger than the number of repetitions of [Co/Pt] in the fourth magnetic layer 330, so that the magnetization directions are opposite to each other. That is, the number of repetitions of [Co/Pt] in the first magnetic layer 210 may be smaller than the number of repetitions of [Co/Pt] in the second magnetic layer 230, and the number of repetitions of [Co/Pt] in the third magnetic layer 310 may be larger than the number of repetitions of [Co/Pt] in the fourth magnetic layer 330, so that the magnetization directions of these magnetic layers are different from each other. For example, the first magnetic layer 210 may be formed of $[Co/Pt]_3$, and the second magnetic layer 230 may be formed of $[Co/Pt]_6$, so that the first magnetic layer 210 is magnetized in the downward direction and the second magnetic layer 230 is magnetized in the upward direction. In addition, the third magnetic layer 310 may be formed of $[Co/Pt]_6$, and the fourth magnetic layer 330 may be formed of $[Co/Pt]_3$, so that the third magnetic layer 310 is magnetized in the upward direction and the fourth magnetic layer 330 is magnetized in the downward direction. Therefore, the first magnetization regulator 200 may be magnetized in the downward direction, and the second magnetization regulator 300 may be magnetized in the upward direction.

The first non-magnetic layer 220 is formed between the first and second magnetic layers 210 and 230, and the second non-magnetic layer 320 is formed between the third and fourth magnetic layers 310 and 330. The first and second non-magnetic layers 220 and 320 are formed of a non-magnetic material allowing for the first and second magnetic layers 210 and 230 and the third and fourth magnetic layers 310 and 330 to be semi-magnetically coupled to each other, respectively.

In addition, the first and second electrodes 240 and 340 are formed on the second and fourth magnetic layers 230 and 330, respectively. The first and second electrodes 240 and 340 may be connected to the outside to input/output data from/to the outside. That is, electrons may be injected or output through the first and second electrodes 240 and 340. The first and second electrodes 240 and 340 may be formed using a conductive material such as metals, metal oxides, and metal nitrides.

3. Controller

The controller 400 is formed on the channel 100 between the first and second magnetization regulators 200 and 300. The controller 400 may be formed to have a wider width than the widths of the first and second magnetization regulators 200 and 300 in the longitudinal direction of the channel 100. The controller 400 outputs the data of the channel 100, the magnetization direction of which is changed as data is potentiated or depressed. That is, the controller 400 outputs current corresponding to the position of the domain wall of the channel 100, the magnetization direction of which is changed as data is potentiated or depressed. In addition, at least a portion of the controller 400 overlapping with the channel 100 is coupled to the channel 100 so that the magnetization direction may be changed, and the controller 400 outputs data potentiated or depressed according to the variation width of the magnetization direction of the channel 100. In this case, the amount of potentiated data may be adjusted according to the length of the region of the controller 400 overlapping with the channel 100. For this purpose, the controller 400 is preferably formed as long as possible while being spaced apart from the first and second magnetization regulators 200 and 300. As shown in FIG. 16, assuming that the length of the channel 100 between the first and second magnetization regulators 200 and 300, i.e., the channel length, is L, the distance between the first magnetization regulator 200 and the controller 400 is a, the distance between the controller 400 and the second magnetization regulator 300 is b, and the width of the controller 400 is w, an equation of $L=a+b+w$ is satisfied, and the amount of potentiated data may be adjusted by the width (w) of the controller 400. That is, the amount of potentiated data in the channel 100 is proportional to the width (w) of the controller 400. Therefore, to increase the amount of potentiated data, the width (w) of the controller 400 may be increased. Conversely, to decrease the amount of potentiated data, the width (w) of the controller 400 may be decreased. For example, the controller 400 may be formed to have a length of about 5/10 to 8/10 of the length (L) of the channel 100. In addition, the amount of potentiated data in the channel 100 may be adjusted by setting the width of the controller 400 to be the same and changing the width and height of a pulse. That is, when at least one of the width and height of a pulse is increased, the amount of potentiated data may be decreased. Conversely, when at least one of the width and height of a pulse is decreased, the amount of potentiated data may be increased. In this case, the pulse width may be 10 ns or less, and the pulse height, i.e., voltage, may be less than 1 V. For example, the neuromorphic device may potentiate data of $2^1$ or more $2^{10}$ or less. In addition, the neuromorphic device may be driven by voltage as described above, and may also be driven by current. When the neuromorphic device is driven by current, current of 2 mA or less may be applied. In addition, the distances (a and b) between each of the first and second magnetization regulators 200 and 300 and the controller 400 are preferably as short as possible to increase the amount of potentiated data within a range within which magnetization effect is not generated therebetween, and may be, e.g., 5 nm or less.

The controller 400 may be formed in a magnetic tunnel junction structure. That is, the controller 400 may include a magnetic tunnel junction in which the free layer 410, the tunneling barrier 420, and the fixed layer 430 are laminated. In addition, the controller 400 may further include the capping layer 440, the synthetic exchanged semi-magnetic layer 450, and the third electrode 460, which are formed on the magnetic tunnel junction. The synthetic exchanged semi-magnetic layer 450 may include the fifth magnetic layer 451, the third non-magnetic layer 452, and the sixth magnetic layer 453. In particular, the free layer 410 is separated from the fixed layer 430 by the tunneling barrier 420, and is separated from the channel layer 140, which is located under the free layer 410, by the separation layer 150 to be coupled with the magnetization direction of the channel layer 140. Therefore, the magnetization direction of the free layer 410 may be changed according to the magnetization direction of the channel layer 140. Accordingly, a tunnel magnetoresistance ratio (TMR) is exhibited according to a state in which the magnetization directions of the fixed layer 430 and the free layer 410 are parallel (RP) or anti-parallel (RAP). Current may be amplified, i.e., fired, when changing from an anti-parallel state to a parallel state.

The free layer 410 may be formed on the separation layer 150. The magnetization direction of the free layer 410 may not be fixed and may be changed from one direction to the opposite direction. That is, the magnetization direction of the free layer 410 may be the same (i.e., parallel) as the magnetization direction of the fixed layer 430, or may be opposite (i.e., antiparallel) to the magnetization direction of the fixed layer 430. In addition, the free layer 410 may be coupled to the channel layer 140 by the separation layer 150 so that the magnetization direction of the free layer 410 may be changed according to the magnetization direction of the channel layer 140. Therefore, when the magnetization direction of the free layer 410 is the same as the magnetization direction of the fixed layer 430 according to the magnetization direction of the channel layer 140, data stored in the channel layer 140 may be amplified and output. That is, when data is stored in the channel layer 140 a predetermined number of times and the magnetization direction of the channel layer 140 under the controller 400 is changed so that the magnetization direction of the free layer 410 becomes the same as the magnetization direction of the fixed layer 430, data stored in the channel layer 140 is output through the second magnetization regulator 300. The free layer 410 is formed of a ferromagnetic substance, such as Full-Heusler semimetal-based alloys, amorphous rare-earth element alloys, multilayer thin films formed by alternately laminating a magnetic metal and a non-magnetic metal, alloys having an L10-type crystal structure, and cobalt-based alloys. Therefore, in another embodiment of the present disclosure, the free layer 410 is formed using a CoFeB monolayer. In this case, CoFeB is formed in an amorphous structure and then textured into BCC (100) by heat treatment.

The tunneling barrier 420 is formed on the free layer 410 to separate the free layer 410 and the fixed layer 430 from each other. The tunneling barrier 420 enables quantum mechanical tunneling between the free layer 410 and the fixed layer 430. In another embodiment of the present disclosure, the tunneling barrier 420 is formed using polycrystalline magnesium oxide. Then, magnesium oxide is textured into BCC (100) by heat treatment.

The fixed layer 430 is formed on the tunneling barrier 420. The magnetization direction of the fixed layer 430 may be fixed in one direction in a magnetic field within a predetermined range, and the fixed layer 430 may be formed of a ferromagnetic substance. For example, the magnetization direction may be fixed in the direction from top to bottom. For example, the fixed layer 430 may be formed of a ferromagnetic substance such as Full-Heusler semimetal-based alloys, amorphous rare-earth element alloys, multilayer thin films formed by alternately laminating a magnetic metal and a non-magnetic metal, and alloys having an L10-type crystal structure. In this case, the fixed layer 430 may be formed of the same ferromagnetic substance as the free layer 410, and is preferably formed of a CoFeB monolayer.

The capping layer 440 is formed on the fixed layer 430 to magnetically separate the fixed layer 430 and the synthetic exchanged semi-magnetic layer 450 from each other. When the capping layer 440 is formed, the magnetization of the synthetic exchanged semi-magnetic layer 450 and the magnetization of the fixed layer 430 are generated independently of each other. In addition, the capping layer 440 may be formed in consideration of the magnetoresistance ratio of the free layer 410 and the fixed layer 430 for operation of a magnetic tunnel junction. The capping layer 440 may be formed of a material allowing crystal growth of the synthetic exchanged semi-magnetic layer 450. That is, the capping layer 440 allows the synthetic exchanged semi-magnetic layer 450 to grow in the crystal orientation. For example, the capping layer 440 may be formed of a metal that facilitates crystal growth in the (111) direction of the face-centered cubic (FCC) lattice or in the (001) direction of the hexagonal close-packed (HCP) structure. In another embodiment of the present disclosure, the capping layer 440 is formed of tantalum. In addition, the capping layer 440 may be formed to have a thickness of 0.3 nm to 0.6 nm. When Ta is used, the capping layer 440 may be formed to have a thickness of 0.4 nm to 0.6 nm. When W is used, the capping layer 440 may be formed to have a thickness of 0.35 nm to 0.55 nm.

The synthetic exchanged semi-magnetic layer 450 is formed on the capping layer 440. The synthetic exchanged semi-magnetic layer 450 serves to fix the magnetization of the fixed layer 430. The synthetic exchanged semi-magnetic layer 450 includes the fifth magnetic layer 451, the sixth non-magnetic layer 452, and the sixth magnetic layer 453. In the synthetic exchanged semi-magnetic layer 450, the fifth and sixth magnetic layers 451 and 453 are antiferromagnetically coupled to each other via the third non-magnetic layer 452. In this case, the magnetization directions of the fifth and sixth magnetic layers 451 and 453 are arranged antiparallel to each other. For example, the fifth magnetic layer 451 may be magnetized in the downward direction (i.e., the direction toward the substrate 110), and the sixth magnetic layer 453 may be magnetized in the upward direction (i.e., the direction toward the third electrode 460). The fifth and sixth magnetic layers 451 and 453 may be formed by alternately laminating a magnetic metal and a non-magnetic metal. For example, the fifth and sixth magnetic layers 451 and 453 may be formed of $[Co/Pd]_n$, $[Co/Pt]_n$, or $[CoFe/Pt]_n$ (n being an integer of 1 or more). The third non-magnetic layer 452 is formed between the fifth and sixth magnetic layers 451 and 453, and is formed of a non-magnetic material that allows the fifth and sixth magnetic layers 451 and 453 to be semi-magnetically coupled to each other.

In addition, the third electrode 460 is formed on the sixth magnetic layer 453. The third electrode 460 may be formed using a conductive material such as metals, metal oxides, and metal nitrides.

As described above, in a neuromorphic device according to another embodiment of the present disclosure, the first and second magnetization regulators 200 and 300 are provided on the channel 100 such that the first and second magnetization regulators 200 and 300 are spaced apart from each other by a predetermined distance, and the controller 400 including a magnetic tunnel junction is provided between the first and second magnetization regulators 200 and 300. In this case, the amount of potentiated data may be adjusted depending on the length of the portion of the channel 100 overlapping with the controller 400. In the neuromorphic device, the first and second magnetization regulators 200 and 300 are magnetized in opposite directions to each other, and the magnetization direction of the channel 100 is set so that the magnetization directions of the free layer 410 and the fixed layer 430 of the controller 400 are opposite to each other in the initial state. In this state, as a predetermined current pulse, i.e., data, is input through the first magnetization regulator 200, the magnetization direction of the channel 100 is sequentially changed, and a domain wall is moved toward the second magnetization regulator 300 accordingly. In this manner, a plurality of data may be potentiated in the channel 100 under the controller 400. In this case, when the magnetization direction of the channel 100 is changed, the magnetization direction of the free layer 410 of the controller 400 may be changed, and potentiated data may be output. However, when a plurality of predetermined current pulses, i.e., data, is input through the second magnetization regulator 300, the magnetization direction may be changed from the last magnetization direction to the initial magnetization direction. That is, the magnetization direction may be changed again from the second magnetization regulator 300 side to the first magnetization regulator 200 side, and a domain wall may be moved toward the first magnetization regulator 200 accordingly. In this manner, a plurality of data potentiated in the channel 100 under the controller 400 may be depressed. In this case, when the magnetization direction of the free layer 410 of the controller 400 is changed according to the magnetization direction of the channel 100, the stored data may be output.

In addition, the following structure was fabricated to confirm the magnetic properties of the first and second magnetization regulators of a neuromorphic device according to another embodiment of the present disclosure. That is, a buffer layer of Ta, a seed layer of MgO, a channel layer of $Co_2Fe_6B_2$, a separation layer of Ta, lower magnetic layers of [Co/Pt], a non-magnetic layer of Ru, upper magnetic layers of [Co/Pt], and an electrode were laminated on a $SiO_2$ substrate. In this case, the buffer layer of Ta, the seed layer of MgO, the channel layer of $Co_2Fe_6B_2$, and the separation layer of Ta formed on the $SiO_2$ substrate correspond to the channel 100. In addition, the lower magnetic layers correspond to the first and third magnetic layers of the first and second magnetization regulators, respectively, and the upper magnetic layers correspond to the second and fourth magnetic layers of the first and second magnetization regulators, respectively. In this case, the first and second magnetization regulators were formed in the same manner, except that the thicknesses of the lower and upper magnetic layers were different. That is, in the first magnetization regulator, the first magnetic layer was formed of $[Co/Pt]_3$, and the second magnetic layer was formed of $[Co/Pt]_6$. In the second magnetization regulator, the third magnetic layer was formed of $[Co/Pt]_6$, and the fourth magnetic layer was formed of $[Co/Pt]_3$. That is, the first and second magnetic layers of the first magnetization regulator were formed by repeating [Co/Pt] three times and six times, respectively. The third and fourth magnetic layers of the second magnetization regulator were formed by repeating [Co/Pt] six times and three times, respectively. In this case, the monolayer of [Co/Pt] was composed of 0.4 nm thick Co and 0.3 nm thick Pt.

Figure 17:
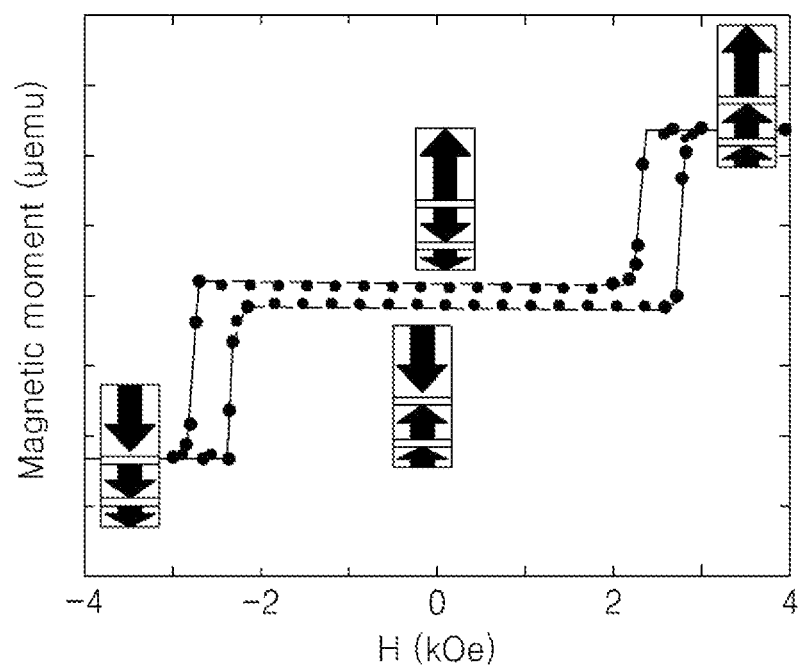
FIGS. 17 and 18 are graphs showing the magnetization properties of the first and second magnetization regulators of a neuromorphic device according to another embodiment of the present disclosure.
Figure 18:
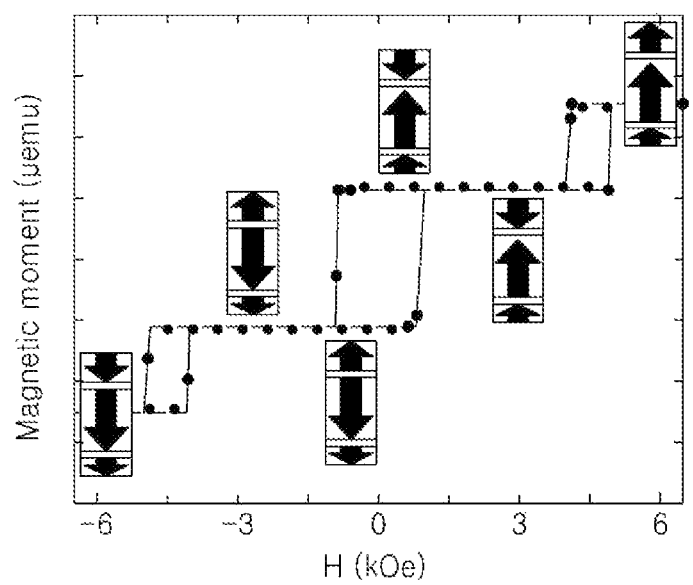

FIGS. 17 and 18 are graphs showing the magnetization properties and magnetization directions of the first and second magnetization regulators depending on external magnetic fields. As shown in FIGS. 17 and 18, the first and second magnetization regulators have three arrows, i.e., three magnetization directions. In order from top to bottom, the first arrow indicates the magnetization direction of the upper magnetic layers (i.e., the second and fourth magnetic layers), the second arrow indicates the magnetization direction of the lower magnetic layers (i.e., the first and third magnetic layers), and the third arrow indicates the magnetization direction of the channel layer. As shown in FIG. 17, in the first magnetization regulator, the magnetization direction of the channel layer is fixed downward in accordance with the magnetization direction of the first magnetic layer in an equilibrium state in which there is no external magnetic field, that is, at 0 kOe. However, as shown in FIG. 18, in contrast to the first magnetization regulator, in the second magnetization regulator, the magnetization direction of the channel layer is fixed upward in accordance with the magnetization direction of the third magnetic layer in an equilibrium state in which there is no external magnetic field.

As described above, in the neuromorphic device of the present disclosure, the first and second magnetization regulators may be magnetized in different directions, and the magnetization direction of the channel layer may be changed accordingly.

In addition, the following structure was fabricated to confirm the magnetization properties of the controller of a neuromorphic device according to another embodiment of the present disclosure. That is, a buffer layer of Ta, a seed layer of MgO, a channel layer of $Co_2Fe_6B_2$, a separation layer of Ta, a free layer of CoFeB, a tunneling barrier of MgO, a fixed layer of CoFeB, a capping layer of Ta, a fifth magnetic layer of [Co/Pt], a third non-magnetic layer of Ru, a sixth magnetic layer of [Co/Pt], and an electrode were laminated on a $SiO_2$ substrate. In this case, the buffer layer of Ta, the seed layer of MgO, the channel layer of $Co_2Fe_6B_2$, and the separation layer of Ta formed on the $SiO_2$ substrate correspond to the channel 100, and the free layer of CoFeB, the tunneling barrier of MgO, and the fixed layer of CoFeB correspond to the magnetic tunnel junction structure, and the fifth magnetic layer of [Co/Pt], the third non-magnetic layer of Ru, and the sixth magnetic layer of [Co/Pt] correspond to the synthetic exchanged semi-magnetic layer. In addition, the fifth magnetic layer was formed of $[Co/Pt]_3$, and the sixth magnetic layer was formed of $[Co/Pt]_6$. That is, the fifth magnetic layer was formed by repeating [Co/Pt] three times, and the sixth magnetic layer was formed by repeating [Co/Pt] six times. In addition, the fifth magnetic layer may be formed of $[Co/Pt]_6$, and the sixth magnetic layer may be formed of $[Co/Pt]_3$. The seed layer of MgO promotes formation of the vertical spin direction of the channel layer of $Co_2Fe_6B_2$, and serves as an insulating film that prevents current from leaking to the bottom, and the tunneling barrier of MgO generates a tunnel magnetoresistance ratio according to the magnetization directions of the free layer of $Co_2Fe_6B_2$ and the fixed layer.

Figure 19A:
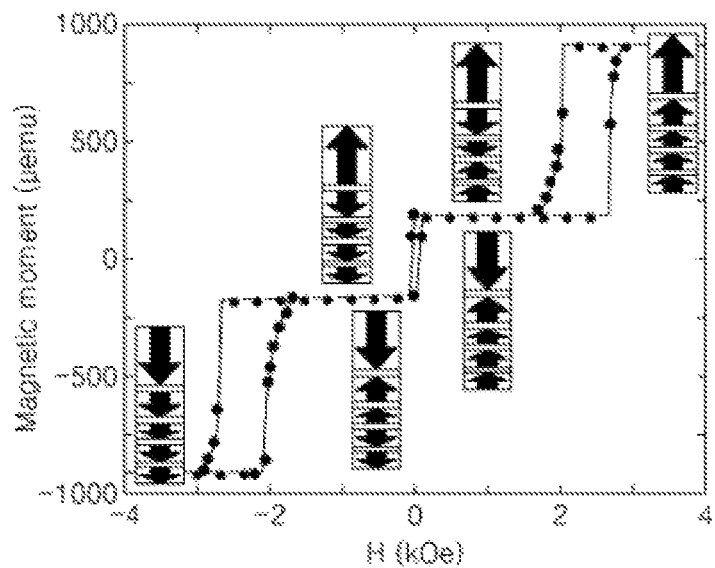
FIGS. 19A and 19B include graphs showing the magnetization properties of the controller of a neuromorphic device according to another embodiment of the present disclosure.
Figure 19B:
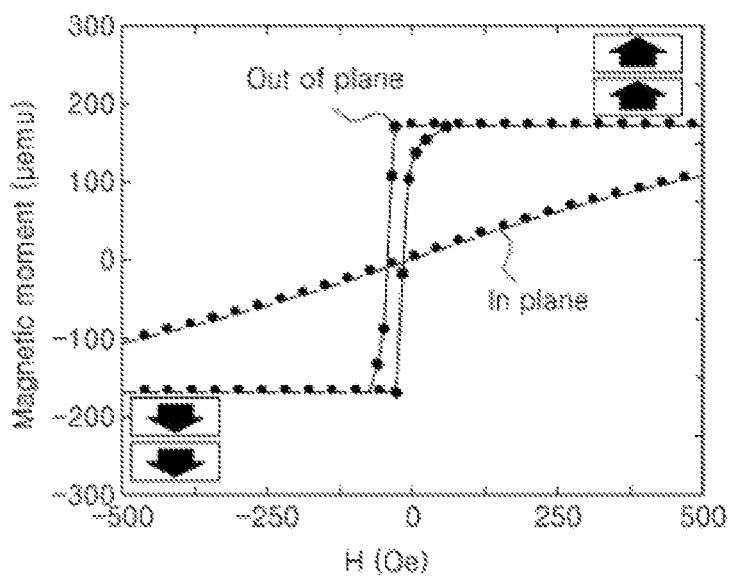

FIG. 19A is a graph showing the magnetization properties and magnetization directions of the controller depending on external magnetic fields. As shown in FIG. 19A, in order from top to bottom, the arrows indicate the magnetization directions of the sixth magnetic layer, the fifth magnetic layer, the fixed layer, the free layer, and the channel layer, respectively. When the graph showing the magnetic properties is enlarged in the range of −500 Oe to +500 Oe, as shown in FIG. 19B, as the external magnetic field changes from + to − or from − to +, the free layer and the channel layer are coupled to each other by the separation layer of Ta. Thus, the magnetization directions of the free layer and the channel layer are always changed to the same direction. In this case, the magnetization direction of the fixed layer is not changed by the fifth magnetic layer, but is fixed.

As described above, in the neuromorphic device of the present disclosure, the free layer of the controller is coupled to the channel layer and the magnetization direction of the free layer is changed according to the magnetization direction of the channel layer.

A method of driving the neuromorphic device according to another embodiment of the present disclosure is described as follows. FIGS. 20 to 34 are schematic diagrams for explaining the method of driving the neuromorphic device according to another embodiment of the present disclosure, and show the magnetization directions of the channel 100, the first and second magnetization regulators 200 and 300, and the controller 400 according to data input (i.e., electron injection). In this case, the magnetization direction of the first magnetization regulator 200 is fixed in the downward direction, and the magnetization direction of the second magnetization regulator 300 is fixed in the upward direction. Data is input through the first magnetization regulator 200, and data is output through the second magnetization regulator 300. In addition, in the controller 400, the lower side is the magnetization direction of the free layer, and the upper side is the magnetization direction of the fixed layer, and the magnetization direction of the fixed layer is fixed in the downward direction by the synthetic exchanged semi-magnetic layer. In addition, FIG. 35 shows voltage pulses input and current output at each step when the neuromorphic device is driven. In this case, FIG. 35 shows current detected through a second magnetization fixing portion when a read voltage of 0.11 V is applied to the controller. In this case, current detected in a unit area, i.e., 1 $cm^2$, is shown. In this embodiment, a case wherein six pieces of data are input and potentiated in the channel is explained.

Figure 20:
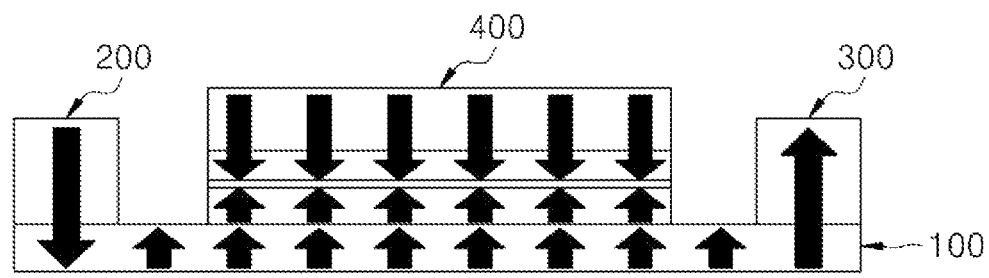
FIGS. 20 to 34 are schematic diagrams for explaining a method of driving a neuromorphic device according to another embodiment of the present disclosure.

Referring to FIGS. 20 and 35, the magnetization direction of the channel 100 is reset (① in FIG. 35). That is, the magnetization direction of the channel 100 is adjusted so that the magnetization directions of the free layer and the fixed layer of the controller 400 are opposite to each other. For example, the channel 100 is magnetized in the upward direction so that the fixed layer is magnetized in the downward direction and the free layer is magnetized in the upward direction. For this purpose, electrons may be injected into the first magnetization regulator 200 from the second magnetization regulator 300. In this case, as shown in FIG. 35, when a control signal, i.e., a read signal, is applied through the controller 400, a low level of current is detected through the second magnetization regulator 300.

Figure 21:
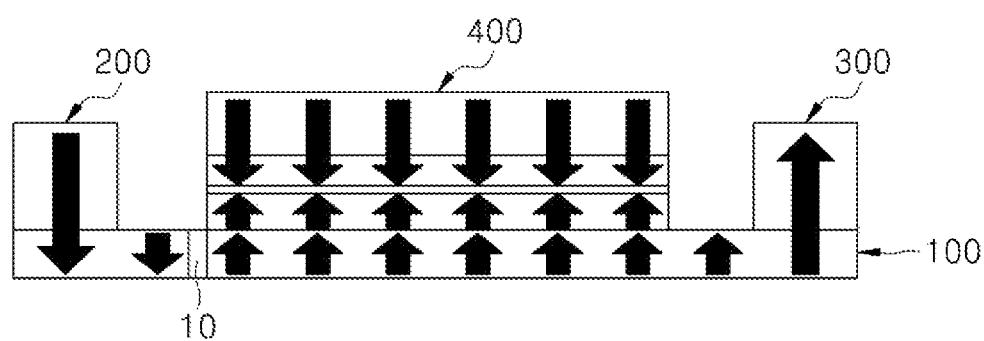

Referring to FIGS. 21 and 35, predetermined data is applied to the channel 100. For this purpose, for example, a pulse signal of 0.15 V is applied through the first magnetization regulator 200 for 0.2 ms (② in FIG. 35). That is, a ground terminal may be connected to the second magnetization regulator 300, and a pulse signal may be applied through the first magnetization regulator 200. In addition, a ground terminal may be connected to the first magnetization regulator 200, and a pulse signal of −0.15 V may be applied through the second magnetization regulator 300 for 0.2 ms. Therefore, electrons are injected once into the channel 100, and the magnetization direction of the channel 100 is partially changed to the downward direction accordingly. That is, the magnetization direction of the channel 100 is changed from the first magnetization regulator 200 side toward the controller 400 by a predetermined width. In this case, the region in which the magnetization direction of the channel 100 is changed may be the region between the first magnetization regulator 200 and the controller 400. In addition, a boundary region in which magnetization directions are opposite to each other, i.e., the domain between magnetization in the downward direction and magnetization in the upward direction, is the domain wall 10. As the magnetization direction is changed, the domain wall 10 is generated and is moved toward the controller 400. In this state, when a read signal is applied to the controller 400, as shown in FIG. 35, a low level of current is detected through the second magnetization regulator 300. This is because the region in which the magnetization direction of the channel 100 is changed is not located under the controller 400 and the magnetization directions of the free layer and fixed layer of the controller 400 are opposite, i.e., anti-parallel.

Figure 22:
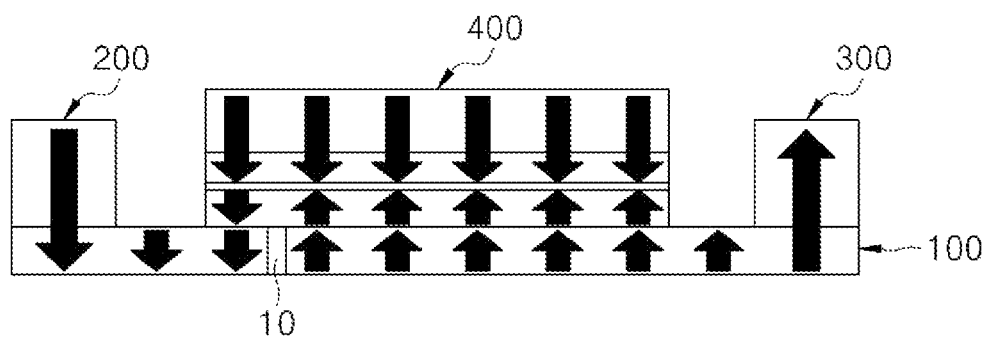
Figure 23:
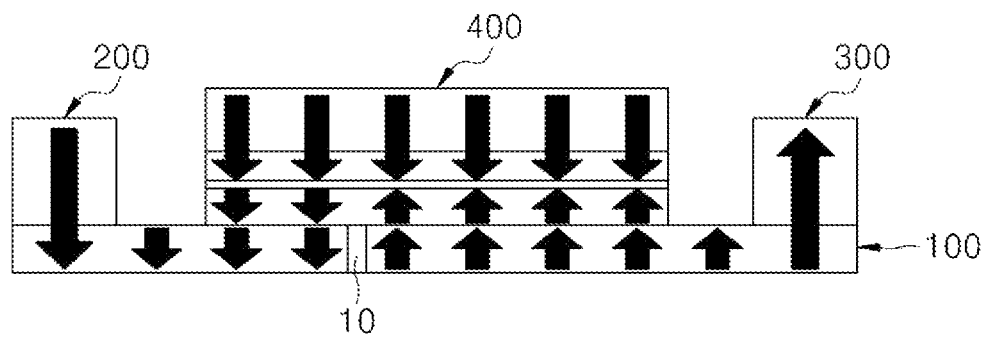
Figure 24:
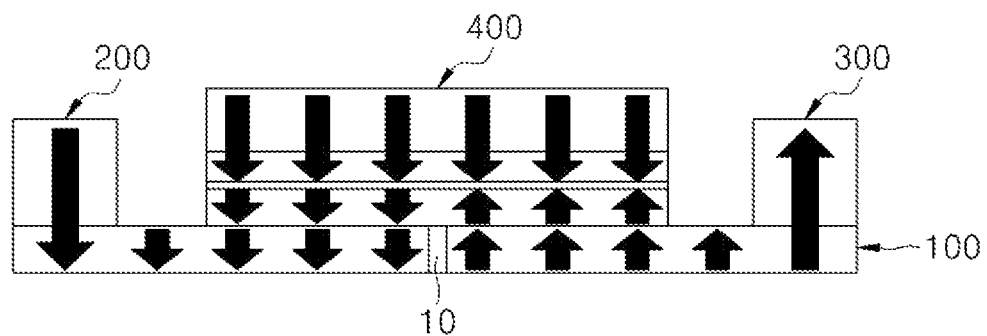
Figure 25:
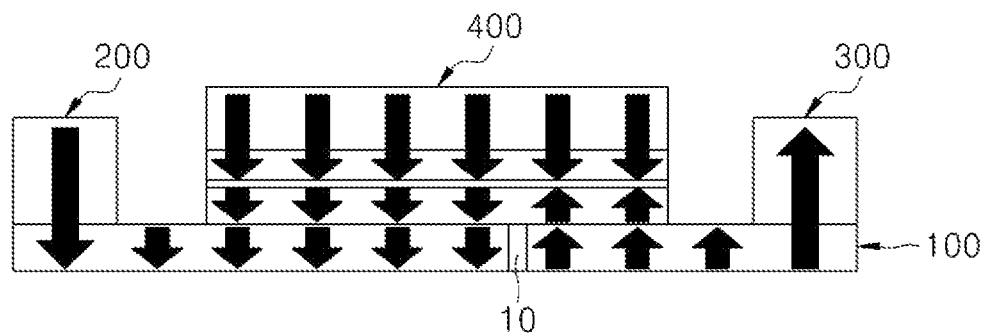
Figure 26:
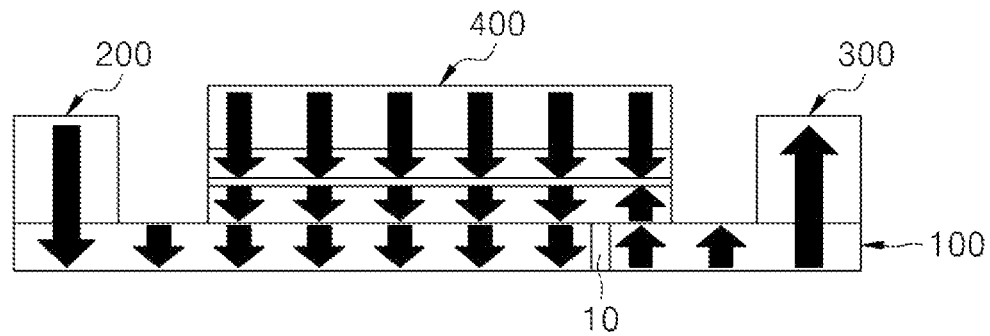
Figure 27:
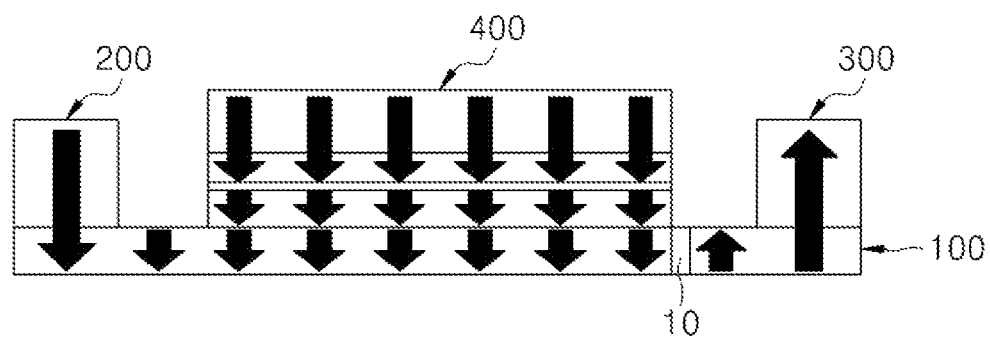

Referring to FIGS. 22 and 35, predetermined data is applied to the channel 100 through the first magnetization regulator 200. For example, a pulse signal of 0.15 V is applied through the first magnetization regulator 200 for 0.2 ms (③ in FIG. 35). Therefore, when electrons are injected into the channel 100 twice, the magnetization direction of the channel 100 is changed to the direction toward the second magnetization regulator 300. That is, the magnetization direction is changed to the downward direction with a wider width than when electrons are injected once. In this case, the magnetization direction of the channel 100 under the controller 400 is partially changed. Therefore, the magnetization direction of a portion of the free layer may be coupled to the channel 100 and may be changed to the downward direction. In addition, the domain wall 10 is moved to the lower side of the controller 400. Therefore, as shown in FIG. 35, current higher than the previous level is detected. This is because the magnetization direction of a portion of the free layer is changed to become the same as the magnetization direction of the fixed layer and current is output by a magnetic tunnel resistance ratio accordingly.

Referring to FIGS. 23 to 27 and FIG. 35, for example, a pulse signal given at 0.15 V for 0.2 ms may be repeatedly applied through the first magnetization regulator 200 (④, ⑤, ⑥, ⑦, and ⑧ in FIG. 35). Therefore, electrons are injected into the channel 100 seven times, and the magnetization direction of the channel 100 under the controller 400 is sequentially changed to the downward direction by a predetermined width. In addition, as the magnetization direction of the channel 100 is changed by a predetermined width, the magnetization direction of the free layer of the controller 400, which overlaps with the magnetization direction of the channel 100, is also changed by a predetermined width. Therefore, the magnetization direction of the free layer is gradually equal to the magnetization direction of the fixed layer. Accordingly, as shown in FIG. 35, it can be detected that the current level is gradually increased. In this manner, as a positive pulse is repeatedly applied through the first magnetization regulator 200, current may be potentiated in the channel 100. That is, a plurality of data may be potentiated in the channel 100.

Figure 28:
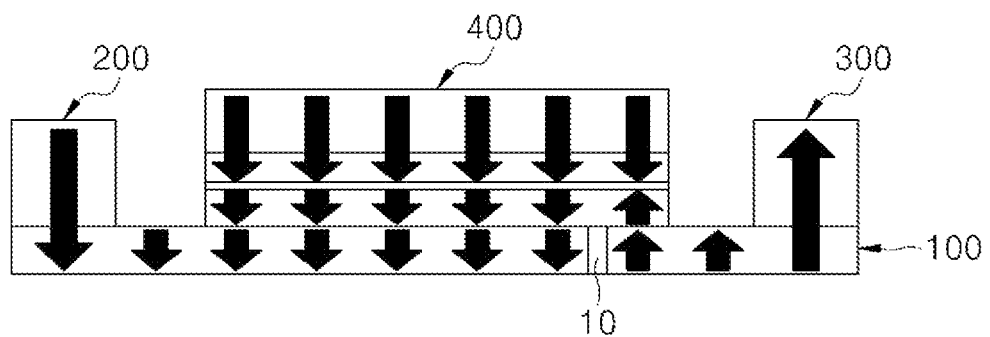
Figure 29:
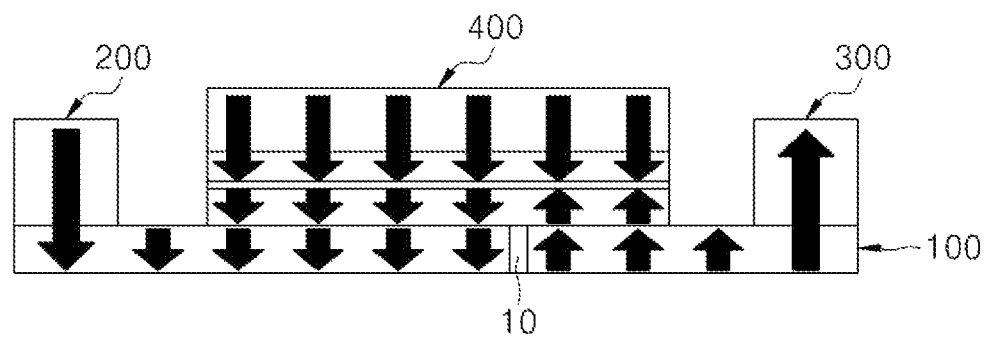
Figure 30:
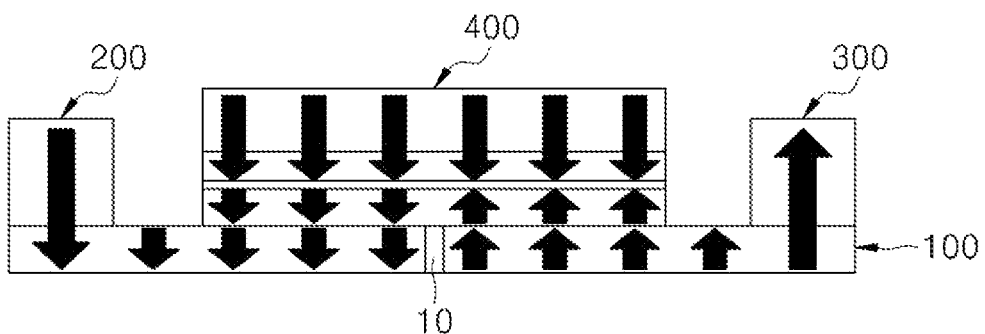
Figure 31:
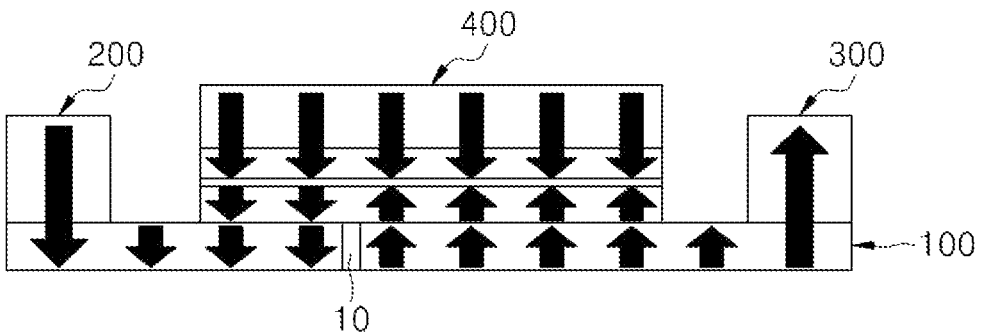
Figure 32:
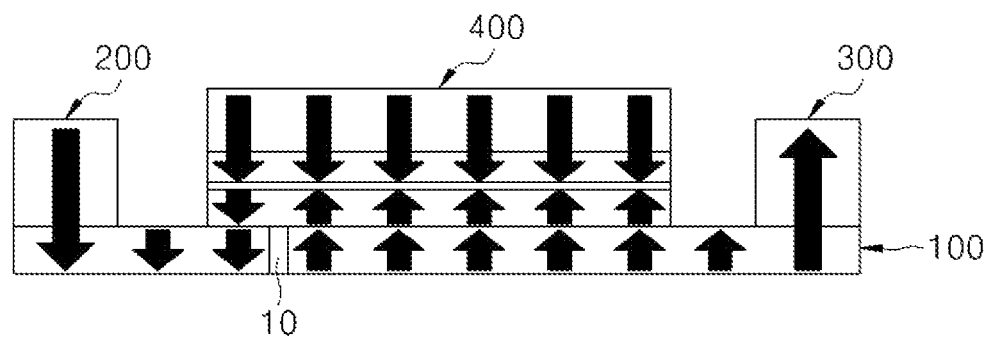

Referring to FIGS. 28 and 35, for example, a pulse signal of −0.15 V is applied through the first magnetization regulator 200 for 0.2 ms. That is, the second magnetization regulator 300 may be connected to a ground terminal, and a negative pulse signal may be applied to the first magnetization regulator 200. In addition, the first magnetization regulator 200 may be connected to a ground terminal, and a positive pulse signal may be applied to the second magnetization regulator 300. Therefore, the magnetization direction of the channel 100 under the controller 400 is changed to the upward direction by a predetermined width (⑨ in FIG. 35). That is, the magnetization direction of the channel 100 is changed to the direction toward the first magnetization regulator 200 by a predetermined width. Therefore, as shown in FIG. 35, as compared with the case of ⑧, current of a low level may be output. In this case, the output current may be the same as in the case of ⑦. That is, since the magnetization direction and magnetization width of the channel 100 are the same in the cases of ⑨ and ⑨, the output current may also be the same in both cases.

Referring to FIGS. 29 to 32 and FIG. 35, for example, when a pulse signal given at −0.15 V for 0.2 ms is repeatedly applied through the first magnetization regulator 200, the magnetization direction of the channel 100 under the controller 400 is changed upward by a predetermined width (⑩, ⑪, ⑫, and ⑬ in FIG. 35). That is, the magnetization direction of the channel 100 may be changed from the second magnetization regulator 300 side to the first magnetization regulator 200 side. Therefore, as shown in FIG. 35, the output current may be gradually decreased. In this manner, as a negative pulse signal is applied through the first magnetization regulator 200, data stored in the channel 100 may be depressed.

Figure 33:
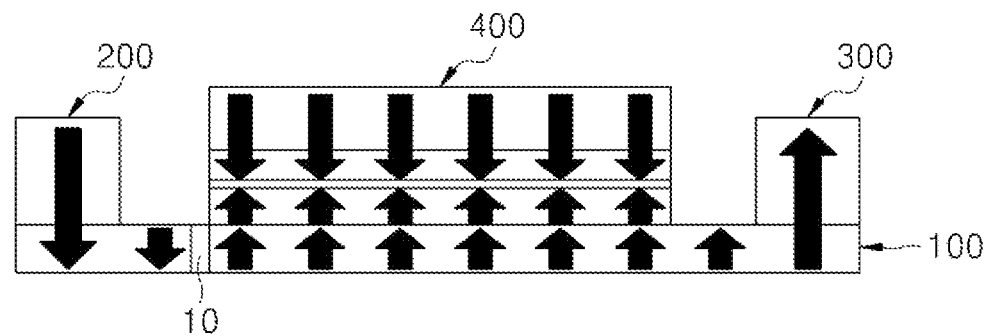

Referring to FIGS. 33 and 35, for example, when a pulse signal given at −0.15 V for 0.2 ms is applied through the first magnetization regulator 200 again, the magnetization direction of the channel 100 is changed to an area outside the controller 400, i.e., the region between the first magnetization regulator 200 and the controller 400 (⑭ in FIG. 35). Therefore, as shown in FIG. 35, a low level of current is output.

Figure 34:
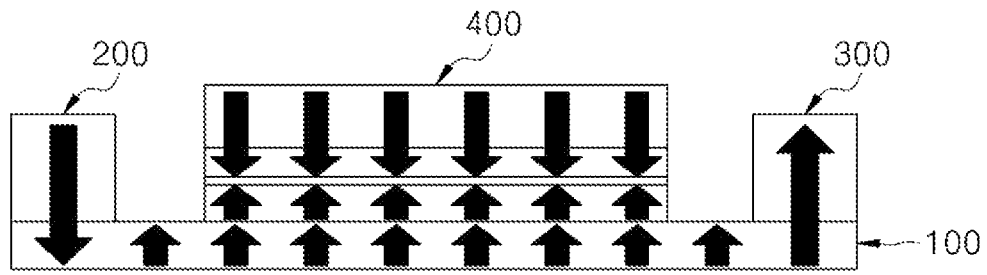
Figure 35:
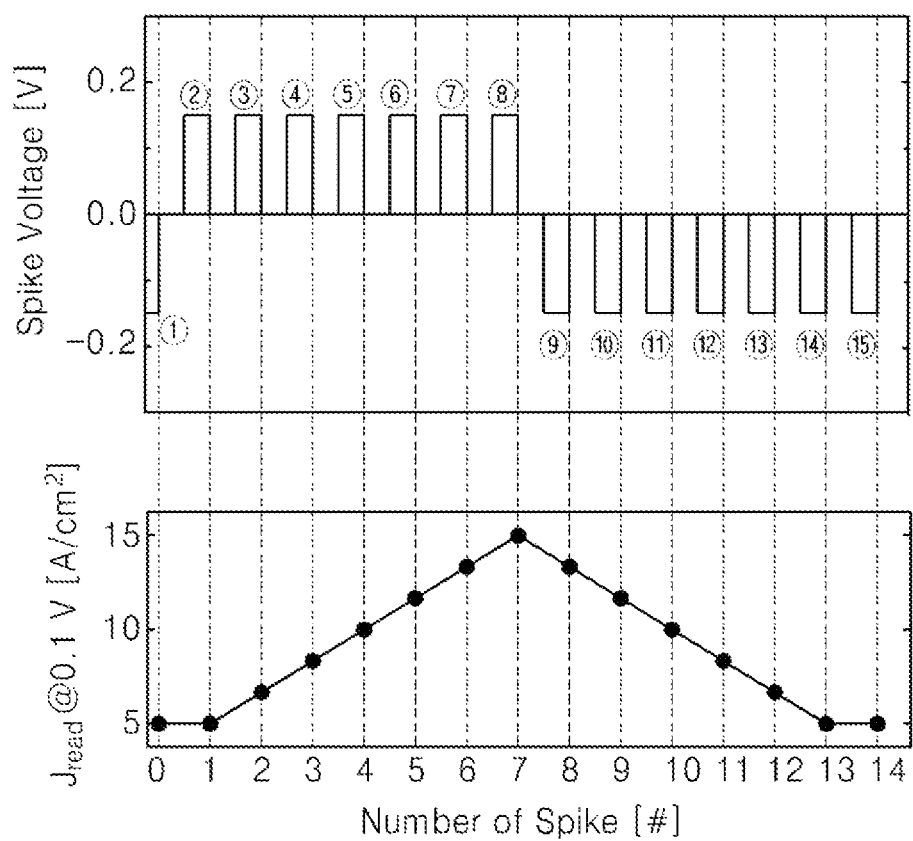
FIG. 35 includes graphs showing input and output waveforms when a neuromorphic device according to another embodiment of the present disclosure is driven.

Referring to FIGS. 34 and 35, for example, when a pulse signal given at −0.15 V for 0.2 ms is applied through the first magnetization regulator 200 again, the magnetization direction of the channel 100 is changed to the upward direction (⑮ in FIG. 35). Therefore, as shown in FIG. 35, a low level of current is output.

The present disclosure may be embodied in many different forms and should not be construed as limited to the embodiments described above. Rather, these embodiments are provided so that this disclosure will be thorough and complete, and will fully convey the scope of the disclosure to those skilled in the art. The scope of the present disclosure should be understood by the appended claims.

The invention claimed is:

1. A neuromorphic device, comprising:
a channel, a magnetization direction of which is changed as a plurality of data is integrated;
first and second magnetization regulators formed on the channel and responsible for changing a magnetization direction of the channel according to a plurality of input data; and
a controller formed on the channel between the first and second magnetization regulators and responsible for firing data integrated in the channel,
wherein the channel comprises a substrate and a channel layer formed on the substrate and having a magnetic layer, and
wherein the channel further comprises a buffer layer and a seed layer, which are formed between the substrate and the channel layer, and a separation layer formed on the channel layer.

2. The neuromorphic device according to claim 1, wherein a magnetization direction of the channel layer is fixed in one direction in an initial state, and the magnetization direction is sequentially changed to a direction opposite to the one direction as the data is sequentially input.

3. The neuromorphic device according to claim 1, wherein data of the channel is input/output through the first and second magnetization regulators.

4. The neuromorphic device according to claim 3, wherein the first and second magnetization regulators have different magnetization directions.

5. The neuromorphic device according to claim 4, wherein the first and second magnetization regulators are formed by laminating a first magnetic layer, a non-magnetic layer, and a second magnetic layer on the channel, respectively, and the first and second magnetic layers have different thicknesses.

6. The neuromorphic device according to claim 4, wherein an initial magnetization direction of the channel is determined by the second magnetization regulator, and a magnetization direction of the channel is sequentially changed when data is input through the first magnetization regulator.

7. The neuromorphic device according to claim 6, wherein the data is integrated in the channel between the first magnetization regulator and the controller.

8. The neuromorphic device according to claim 1, wherein the controller comprises a magnetic tunnel junction in which a free layer, a tunneling barrier, and a fixed layer are laminated;
a capping layer formed on the magnetic tunnel junction; and
a synthetic exchanged semi-magnetic layer formed on the capping layer and responsible for fixing a magnetization direction of the fixed layer.

9. The neuromorphic device according to claim 8, wherein, in the controller, a magnetization direction of the fixed layer is fixed and a magnetization direction of the free layer is changed according to a magnetization direction of the channel layer.

10. The neuromorphic device according to claim 9, wherein the free layer and the fixed layer are magnetized in opposite directions in an initial state, and data integrated in the channel is fired when the free layer and the fixed layer are magnetized in identical directions by magnetization of the channel.

11. The neuromorphic device according to claim 10, wherein the controller has a width of ⅕ to ⅒ of a length of the channel between the first and second magnetization regulators.

12. The neuromorphic device according to claim 11, wherein an amount of integrated data is adjusted according to at least one of a length of the channel between the first magnetization regulator and the controller, a width of the controller, and a width and height of a pulse applied to input data.

13. The neuromorphic device according to claim 12, wherein, in the channel, data of $2^1$ to $2^{10}$ is integrated.

14. A neuromorphic device, comprising:
- a channel in which a domain wall is moved as a plurality of data is input and integrated;
- a first magnetization regulator responsible for moving the domain wall of the channel according to a plurality of input data;
- a second magnetization regulator having a magnetization direction different from a magnetization direction of the first magnetization regulator and responsible for fixing a magnetization direction of the channel in one direction; and
- a controller, wherein at least a portion of the controller is coupled to the channel so that a magnetization direction of the controller is changed, and data integrated in the channel is fired when the domain wall passes a bottom of the controller.

15. The neuromorphic device according to claim 14, wherein at least a portion of each of the channel, the first and second magnetization regulators, and the controller comprises a magnetic material.

16. The neuromorphic device according to claim 15, wherein, in the controller, a magnetization direction of a first region is fixed and a magnetization direction of a second region under the first region is changed according to a magnetization direction of the channel, and data integrated in the channel is fired when magnetization directions of the first and second regions are identical to each other.

17. A method of driving a neuromorphic device, comprising:
- a step of setting a magnetization direction of a channel so that magnetization directions of a free layer and a fixed layer of a controller are opposite to each other;
- a step of sequentially changing a magnetization direction of the channel by sequentially inputting a plurality of data; and
- a step of firing data integrated in the channel when a magnetization direction of the channel overlapping with the controller is identical to a magnetization direction of the free layer,
- wherein the free layer of the controller is coupled to a channel layer and a magnetization direction of the free layer is changed according to a magnetization direction of the channel layer.

18. The method according to claim 17, wherein a variation width of a magnetization direction of the channel is adjusted according to at least one of a length of the channel, a width of the controller, and a width and height of a pulse applied to input data.

* * * * *